United States Patent [19]

Marks

[11] Patent Number: 4,720,642
[45] Date of Patent: Jan. 19, 1988

[54] FEMTO DIODE AND APPLICATIONS

[76] Inventor: Alvin M. Marks, Bigelow Rd., Athol, Mass. 01331

[21] Appl. No.: 637,405

[22] Filed: Aug. 3, 1984

Related U.S. Application Data

[63] Continuation-in-part of Ser. No. 462,240, Mar. 2, 1983, which is a continuation-in-part of Ser. No. 330,791, Dec. 15, 1981, Pat. No. 445,050.

[51] Int. Cl.$^4$ .............................................. H01L 15/00
[52] U.S. Cl. ................................. 307/150; 307/149; 357/19; 357/30; 250/211 J; 340/703
[58] Field of Search ............... 307/145, 149, 150, 151; 357/19, 23.1, 23.15, 24, 33; 250/211 R, 211 J; 340/701, 703, 762, 782, 767, 784

[56] References Cited

U.S. PATENT DOCUMENTS

| | | | |
|---|---|---|---|
| 3,329,823 | 7/1967 | Handy et al. | 250/211 J |
| 3,491,241 | 1/1970 | Lehovec | 250/211 J |
| 3,493,767 | 2/1970 | Cohen | 357/30 X |
| 3,501,638 | 3/1970 | Compton et al. | 357/30 X |
| 3,560,750 | 2/1971 | Nagata | 357/19 X |
| 3,654,531 | 4/1972 | Krambeck et al. | 357/23.1 X |
| 3,675,026 | 7/1972 | Woodall | 250/211 J |
| 3,742,223 | 6/1973 | Carr et al. | 250/211 J |
| 3,761,711 | 9/1973 | Hall | 357/30 X |
| 3,781,549 | 12/1973 | Fletcher et al. | 250/211 J |
| 3,794,891 | 2/1974 | Takamiya | 357/30 |
| 3,795,803 | 3/1974 | Ancker-Johnson | 250/211 J X |
| 3,809,953 | 5/1974 | Nishizawa | 357/30 |
| 3,872,489 | 3/1975 | Hagenlocher | 357/30 X |
| 3,927,385 | 12/1975 | Pratt, Jr. | 357/19 X |
| 4,000,505 | 12/1976 | Epstein et al. | 357/23.1 X |
| 4,016,586 | 4/1977 | Anderson et al. | 357/30 X |
| 4,024,558 | 5/1977 | Merrin | 357/30 X |
| 4,301,592 | 11/1981 | Lin | 357/30 X |
| 4,490,709 | 12/1984 | Hammond et al. | 357/30 X |
| 4,492,811 | 1/1985 | Switzer | 357/30 X |

Primary Examiner—William M. Shoop, Jr.
Assistant Examiner—Paul Ip

[57] ABSTRACT

A Femto Diode responsive to light frequencies, is described. Quantum principles are utilized. The Femto Diode comprises a submicron metal cylinder with an assymetric metal-insulator-metal tunnel junction at one end and a reflecting potential step at the other end. A light photon having a quanta of energy is absorbed by an electron in the cylinder producing an energetic electron. The cylinder acts as a potential well for the energetic electron, which travels back and forth in its own conduction band without loss of energy until it passes through the junction. The kinetic energy of the energetic electron is converted to electric energy at a greater voltage on the other side of the junction. The energy conversion is reversible.

The Femto Diode may be used in light to electric power conversion, a laser which converts electric power to light power, 2D and 3D displays, high speed computers, communications and other devices.

27 Claims, 23 Drawing Figures

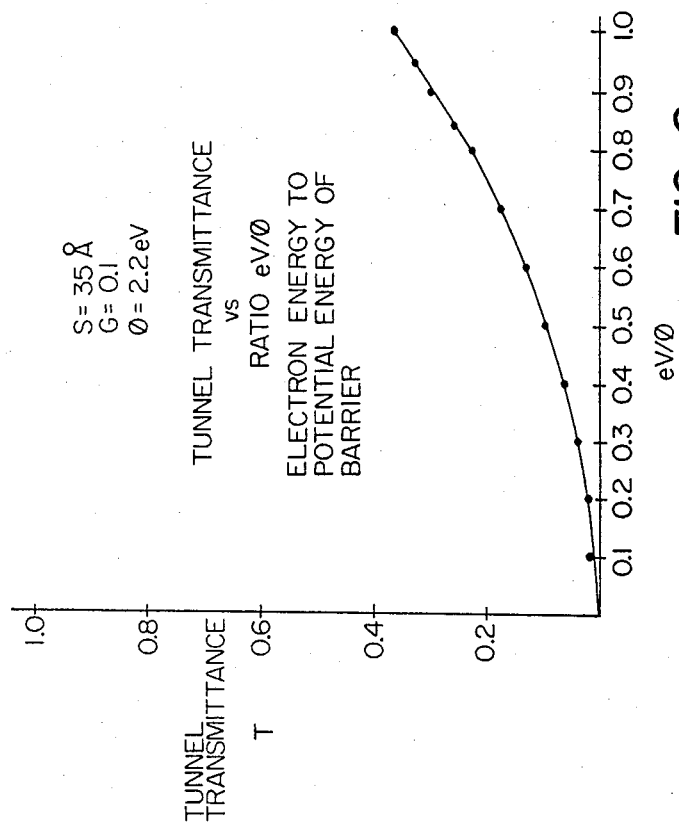
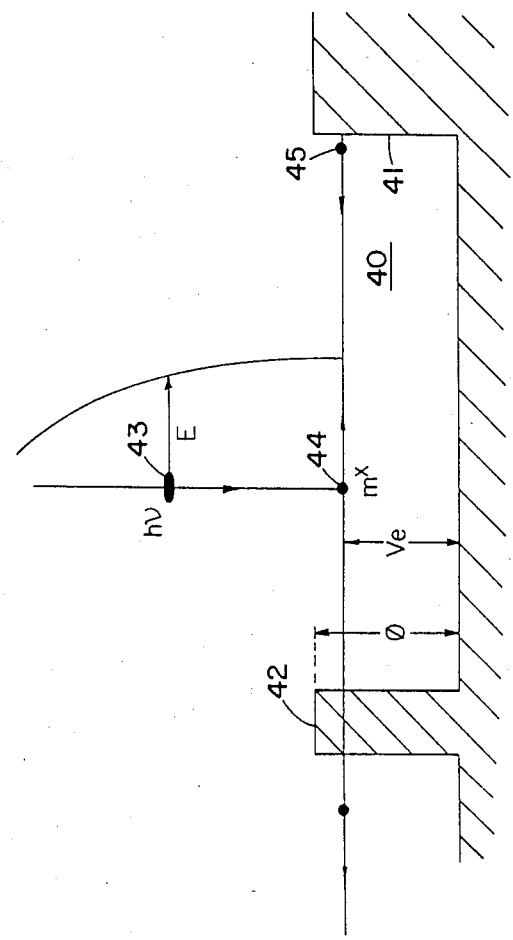

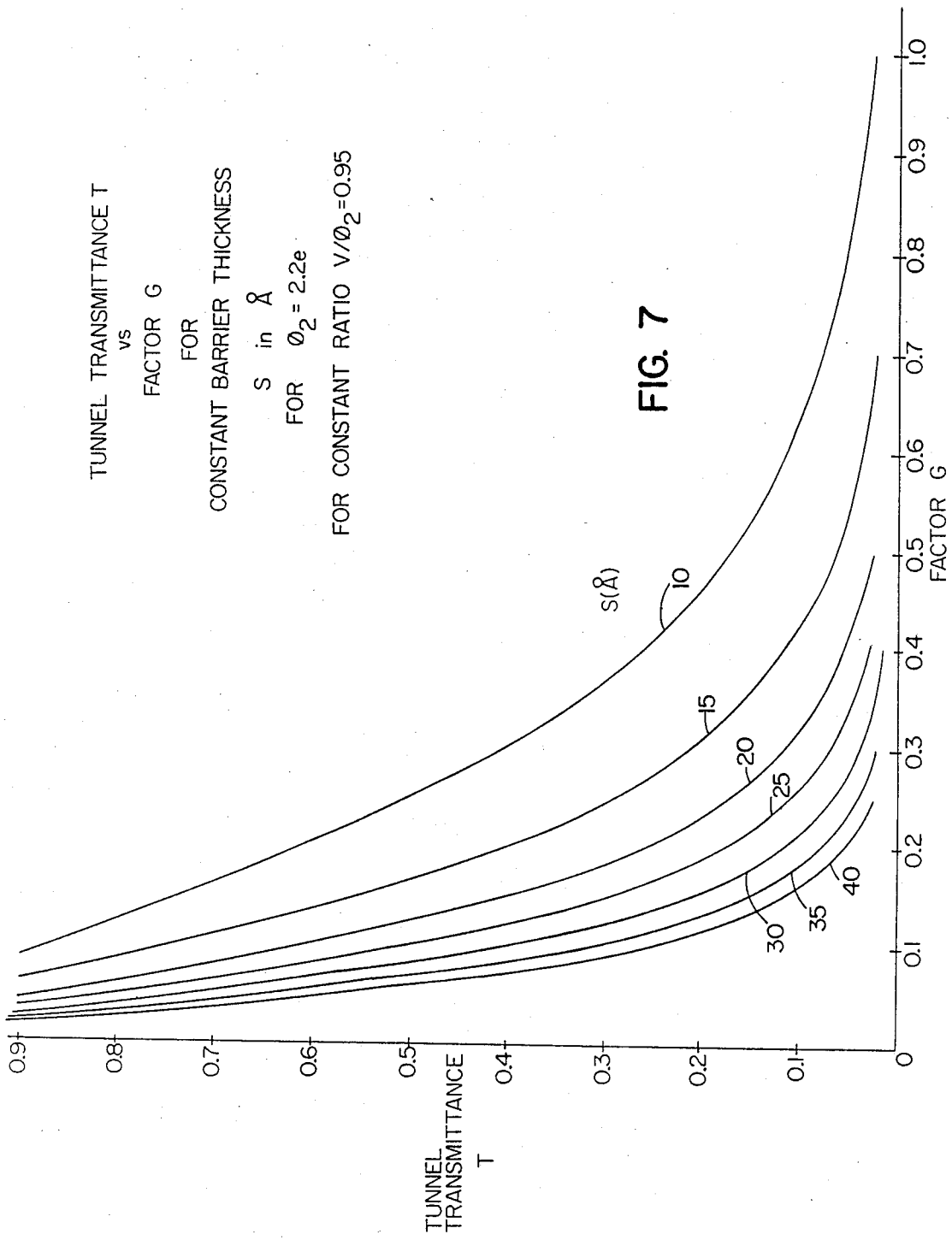

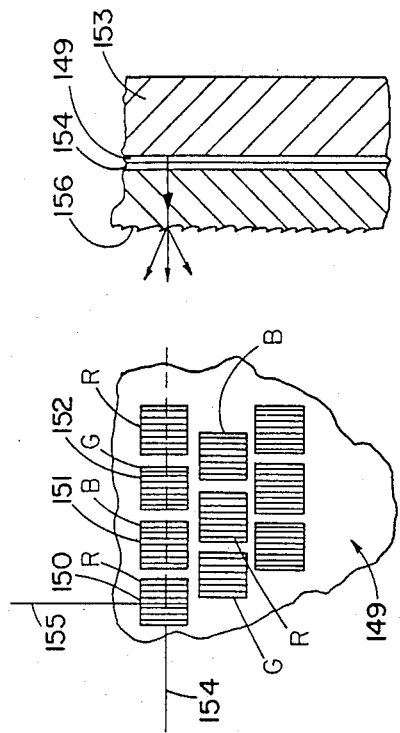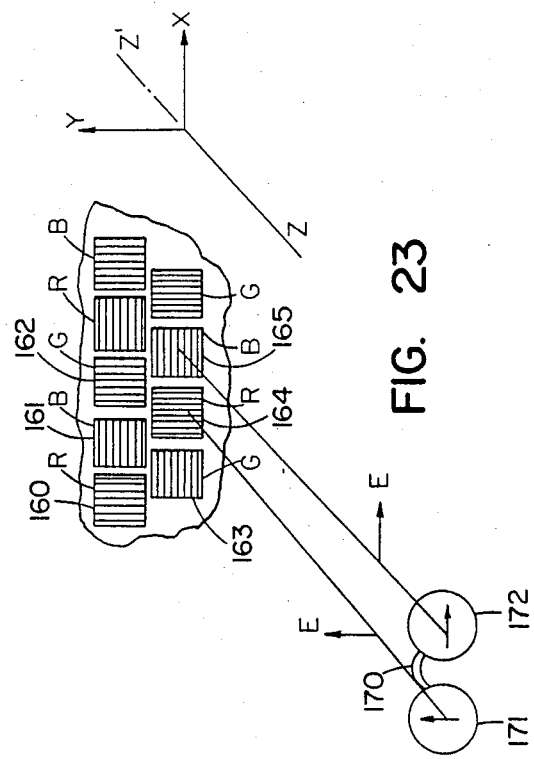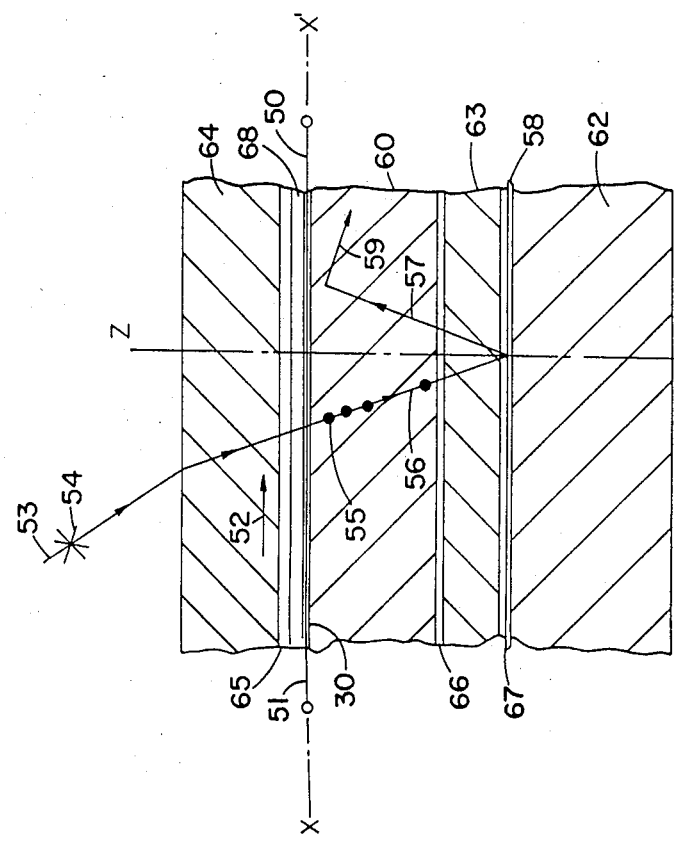

FEMTO DIODE AND APPLICATIONS

RELATED APPLICATIONS

The present application is a continuation in part of pending specification Ser. No. 462,240, filed Mar. 2, 1983 entitled "Improvements in Light Electric Power Conversion"; which is a continuation in part of specification Ser. No. 330,791, filed Dec. 15, 1981, entitled "Device for Conversion of Light Power to Electric Powder", now issued as U.S. Pat. No. 4,445,050 on Apr. 24, 1984, all to the inventor Alvin M. Marks, the subject matter of which is included herein by reference.

FIELD OF THE INVENTION

This invention relates to an electric rectifying device (Femto Diode) of submicron dimensions which converts incident quanta (photons, plasmons) of electromagnetic energy in the light frequency range ($10^{15}$ Hz) to a direct current of electricity, and to various applications.

One of the applications of this invention, described in Section 12.51 herewith is the subject of an earlier patent application entitled "2D/3D Compatible Color TV System", inventor Alvin M. Marks Ser. No. 523,705, filed Aug. 16, 1983.

DEFINITIONS

Macro Regime: The regime for large-scale devices having a dimension L>0.5 μm, in which conventional electrical laws apply.

Quantum Regime: The regime for submicron devices having a dimension L<0.5 μm, in which the laws of quantum electrodynamics apply.

Femto Sec.: $10^{-15}$ sec (Femto means fifteen) The light period (time per cycle) for blue and red light respectively varies from 1.3 to 2.3 $\times 10^{-15}$ sec or 1.3 to 2.3 Femto sec.

Femto Diode: A diode of this invention operating in the quantum regime which is reponsive to visible light frequencies.

Symmetric Tunnel Junction: A metal/insulator/metal barrier junction with the same metal used on both sides of the barrier. The forward/reverse currents are the same but the resistance varies with the voltage across the junction.

Assymetric Tunnel Junction: A metal/insulator/metal junction with different metals; i.e. metal 1 and metal 2, on each side of an insulating barrier layer. The forward/reverse currents are different.

"Energetic" Electron: An electron which has absorbed a quantum of light energy (1.8 to 3.1 eV) and which is traveling in the metal cylinder in its own conduction band at a corresponding large velocity and distance almost without collision; and which exhibits quantum regime properties.

"Thermal" Electron: An electron which travels at a small velocity due to its thermal energy of about 0.025 eV; which makes frequent collisions; and which exhibits its macroregime properties.

BACKGROUND

The present invention relates to an improved diode, known as a "Femto Diode", for use in the light-electric power converter (LEPCON TM), and many other applications: high-power laser D.C. electric-light conversion, super high speed light-electric communication and computer operation. The Femto Diode is capable of rectifying electric oscillations having Femto ($10^{-15}$) second periods corresponding to the visible light range; that is, operating in the frequency range of 4 to $8 \times 10^{14}$ Hz, which is greater than heretofore possible with prior art devices. The Femto Diode of this invention has the new, unusual, and long-sought property of operation in the light frequency range. Table 1 shows light color versus wavelength, period, frequency and energy in practical and MKS/SI Units.

The Femto Diode of this invention utilizes an assymetric tunnel junction comprising a metal 1/insulator/metal 2 in a wall step configuration. New and novel combinations of materials and dimensions are disclosed to maximize the forward/reverse current ratio. The materials are simple, inexpensive, readily available and nontoxic.

New metals and combinations with oxides are utilized in the tunnel junction to obtain the particular values of the work functions $\phi_1$ and $\phi_2$ of metals 1 and 2, barrier thickness s and cross-sectional area A for optimum electrical properties. The diode structure may be protected by vacuum, inert gas, encapsulating glass or plastic layers, or laminated to prevent a destructive reaction with air (oxygen) and/or water.

A comprehensive review and bibliography on Electron Tunnelling through an insulating barrier has been given[1]. Tunnel Diodes (metal/oxide/metal) were observed to rectify at optical frequencies but the response was small.[2,3,4]

These prior art junctions were symmetric in structures: Al/Al$_2$O$_3$/Al or Ni/NiO/Ni with a minimum cross-sectional area 1000 Å $\times$ 1000 Å; the antenna used was in the micron length range and so performed poorly in the quantum regime. The need for a new approach was stressed.[3.1]

The mathematical physics theory of Symmetric Tunnel Junctions has been described[5,6,7]; and extended to an Assymmetric Tunnel Junction, on which the basic equations were established.[8] However, the particular conditions requisite for a tunnel junction suitable for use in the quantum regime were unknown; in particular the conditions required for a high tunnel probability suitable for use in the Femto Diode of this invention were not known.

TABLE I

| LIGHT-COLOR VS. WAVELENGTH, PERIOD, ANGULAR FREQUENCY, FREQUENCY AND ENERGY | | | | | | | |
|---|---|---|---|---|---|---|---|
| NAME | COLOR | WAVELENGTH | PERIOD | ANGULAR FREQUENCY | FREQUENCY | ENERGY | |
| SYMBOL | — | λ | T | ω | ν | ϵ | |
| UNITS PRACTICAL | — | Å ANGSTROMS | BEMTOSEC | RADIANS PER SEC | HERTZ CYCLES/SEC | eV = hν ELECTRON-VOLTS | — |
| UNITS MKS/IU | — | $10^{-10}$m | $10^{-15}$s | $\times 10^{-15}$ | $\times 10^{15}$ | — | JOULES $\times 10^{-19}$ |
| — | RED | 7000 | 2.336 | 2.69 | 0.428 | 1.77 | 2.835 |
| — | GREEN | 5600 | 1.869 | 3.36 | 0.535 | 2.21 | 3.540 |

TABLE I-continued
LIGHT-COLOR VS. WAVELENGTH, PERIOD, ANGULAR FREQUENCY, FREQUENCY AND ENERGY

| NAME | COLOR | WAVELENGTH | PERIOD | ANGULAR FREQUENCY | FREQUENCY | | ENERGY |
|---|---|---|---|---|---|---|---|
| — | BLUE | 4000 | 1.333 | 4.71 | 0.750 | 3.1 | 4.966 |

IN THE FIGURES

FIG. 4 shows an idealized energy diagram of the Femto Diode of this invention, showing a potential well, with a semi-permeable tunnel barrier at one end, and a total reflection step at the other end.

FIG. 7 shows a graph of Tunnel Transmittance of an energetic electron through a junction versus the Factor G for various constant barrier thicknesses s in Å.

FIG. 8 shows a graph of Tunnel Transmittance versus the ratio of electron energy eV to the potential energy $e\phi$ of the barrier, for the particular values listed.

FIG. 16 shows an improved light-electric power converter in combination with a rotator and reflector to convert both resolved components of light to electric power with a single LEPCON TM layer.

Figure 17:
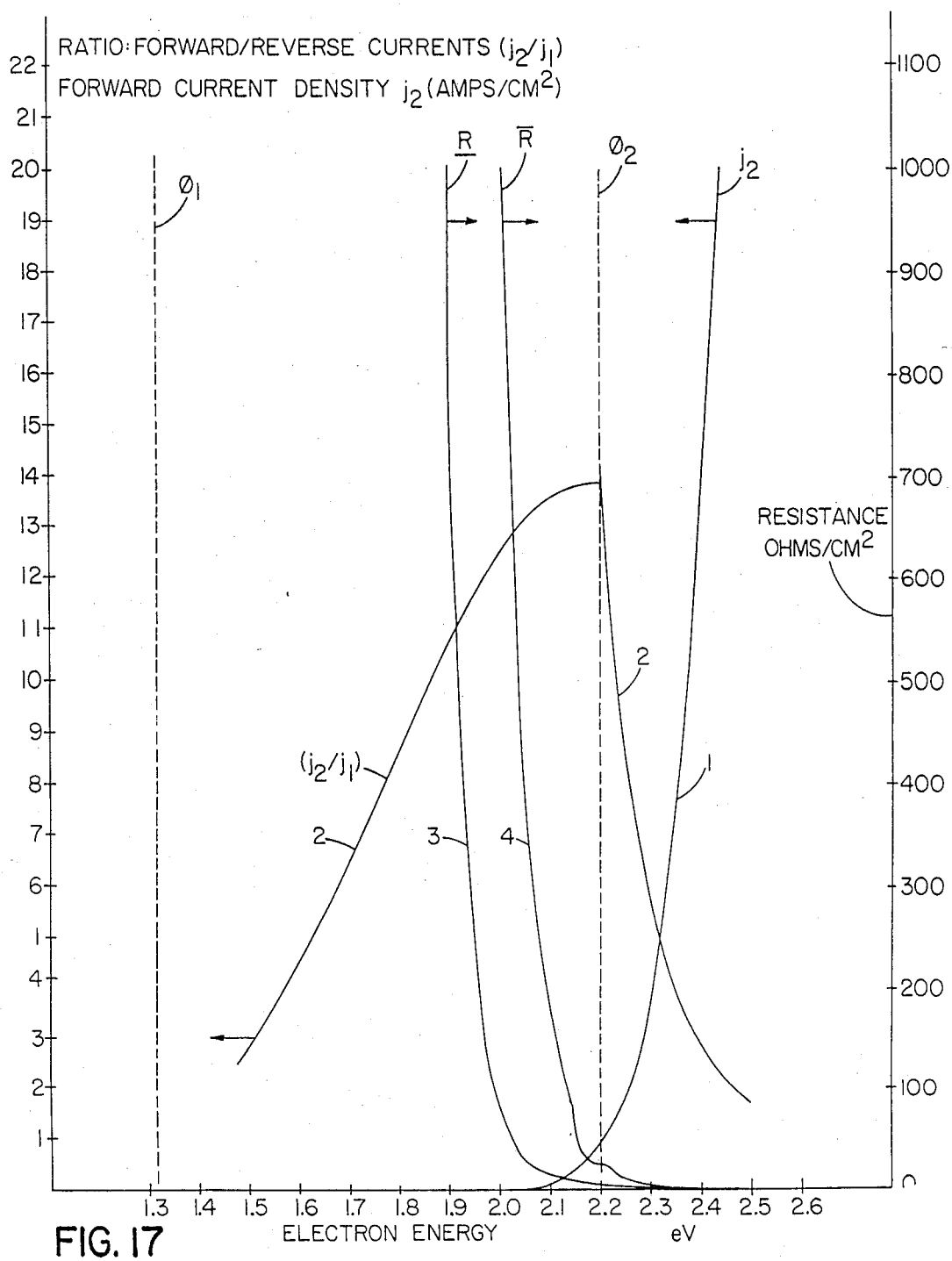

FIG. 17 shows for a tunnel junction useful in a light/electric power converter graphs of calculations:
(1) Forward Current Density $j_2$ A/cm$^2$
(2) Ratio Forward/Reverse Currents $(j_2/j_1)$
(3) Forward Resistance/Unit Area R ohms/cm$_2$
(4) Reverse Resistance/Unit Area R ohms/cm$_2$
(5) Quantum Forward Resistance/Unit Area $R_o$ ohms/cm$^2$
(6) Intermediate of (3) and (5) $R_1$ ohms/cm$^2$ versus Electron Energy eV and Light Wavelength in Å

Figure 15:
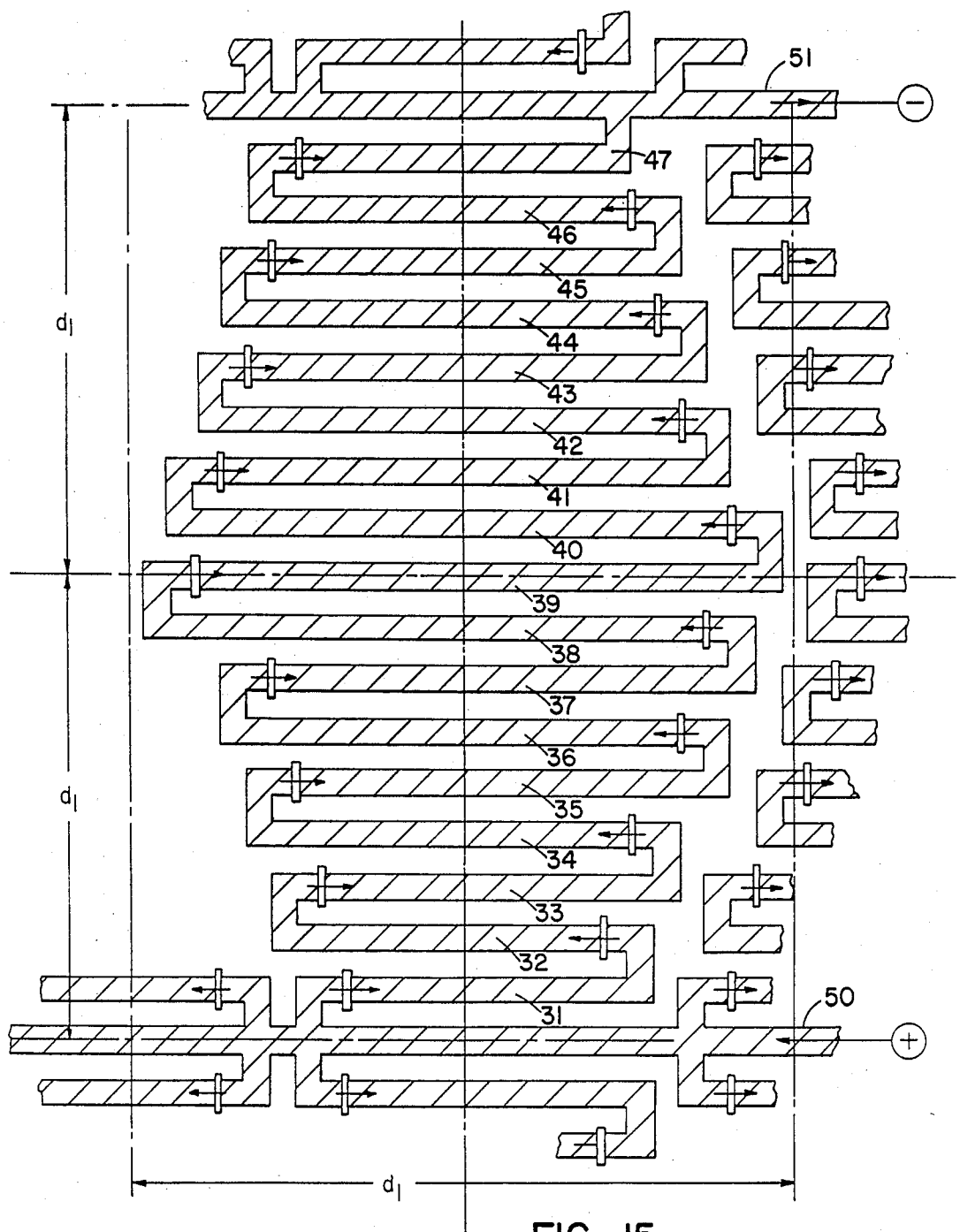
FIG. 15 shows an improved light-electric power converter (LEPCON TM) comprising $9\lambda/4$ dipoles in series, each with a Femto Diode.

The tunnel junction characteristics in this figure relate to the requirements for a light/electric power converter shown in FIG. 15.

Figure 18:
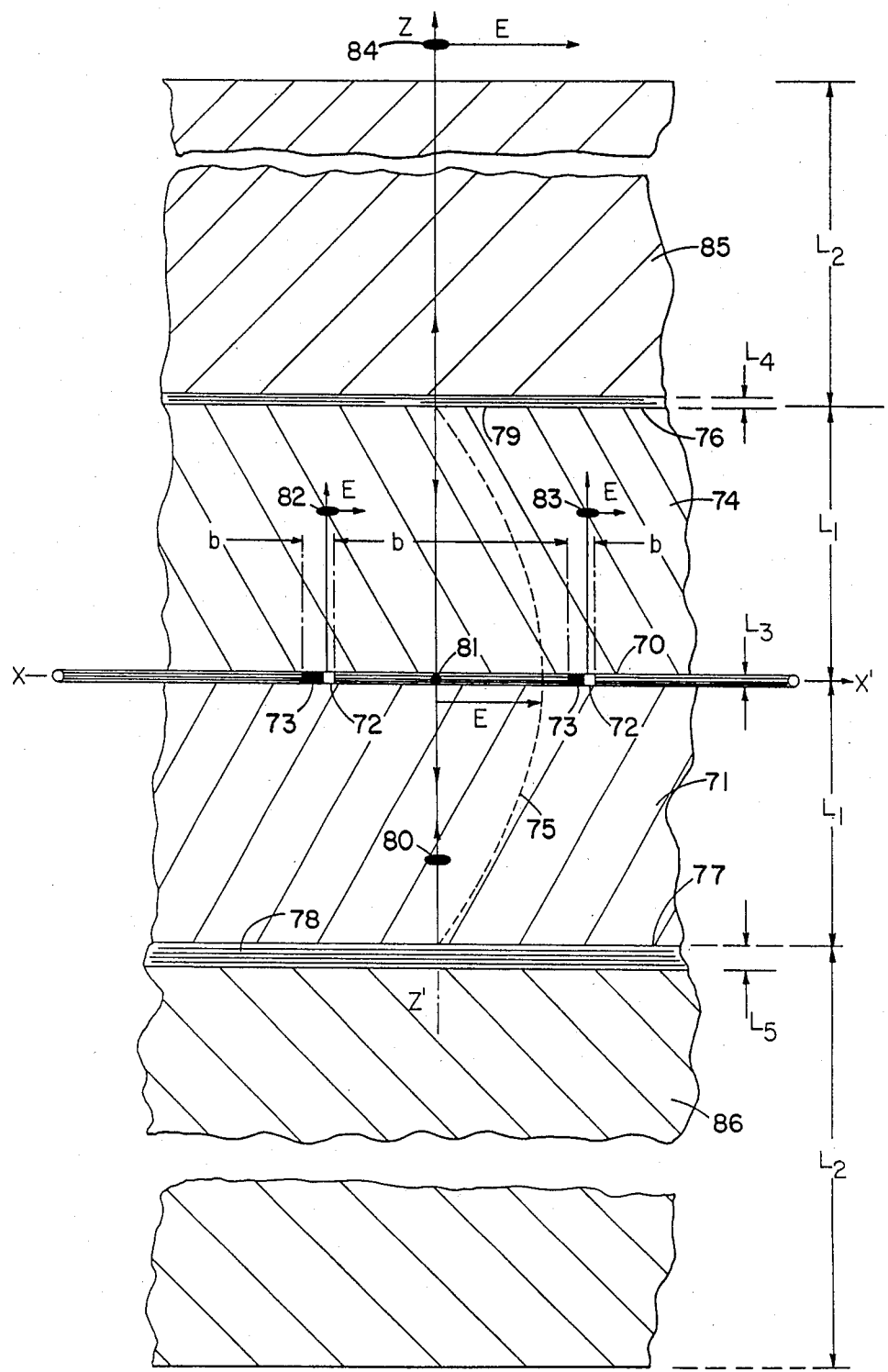

FIG. 18 shows diagrammatically an electric power to light converter or laser, herein termed an "ELCON" TM, utilizing a Femto Diode, a dipole antenna array, and a resonant cavity.

Figure 19:
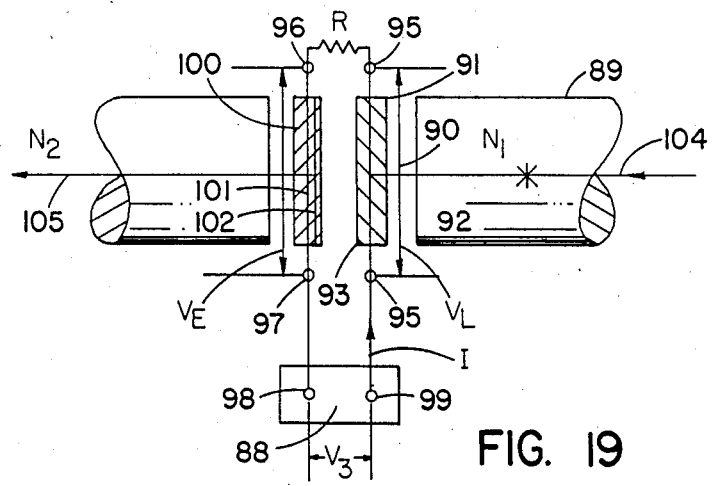

FIG. 19 diagrammatically shows a small ELCON TM electric/light converter utilized as a light amplifying repeater for a fiber-optics link.

Figure 20:
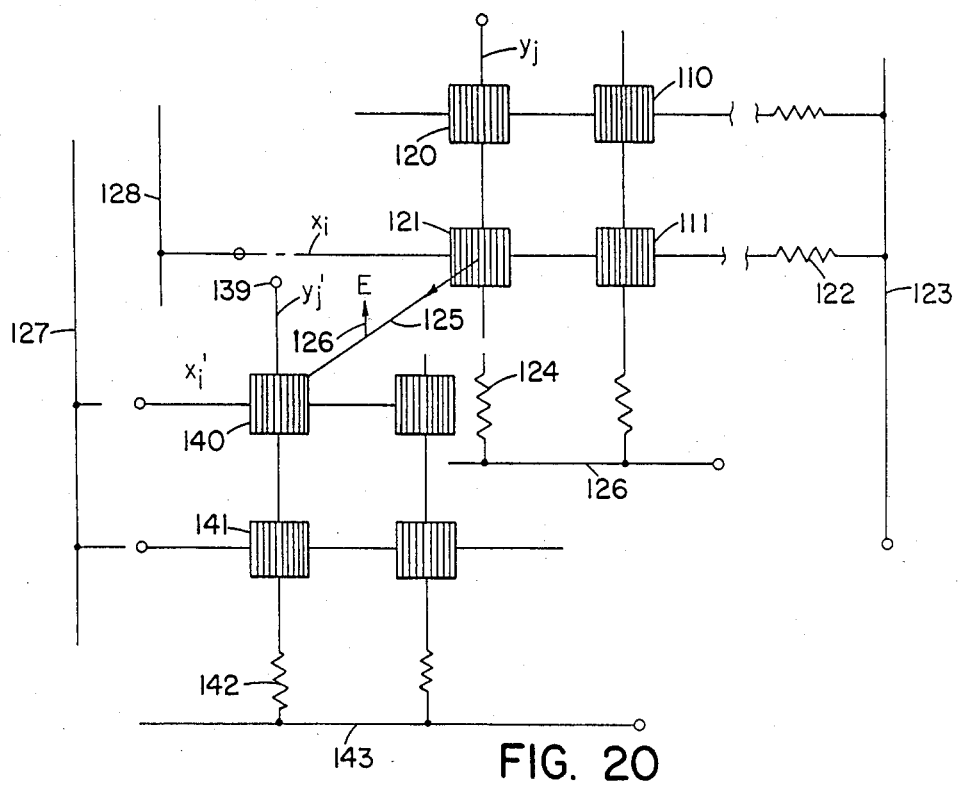

FIG. 20 diagrammatically shows an isometric exploded view of ELCON TM electric/light Emitter/LEPCON TM light/electric Converter elements in a computer logic circuit.

FIG. 21 diagrammatically shows a plan view of a flat display device utilizing miniature ELCON TM light emitters as pixels.

FIG. 22 shows a cross-sectional view of the device of FIG. 21.

FIG. 23 shows ELCON TM emitters used for orthogonally polarized colored pixels in a compatible 2D/3D-Color panel and system.

DESCRIPTION OF THE INVENTION

The Femto Diode of this invention operates in the quantum regime. It comprises a cylinder of metal which has a maximum dimension of about 1000 Å. The input of energy quanta in the light frequency range (1.8 to 3.1 eV) produces individual energetic electrons in the metal cylinder. According to the laws of quantum electrodynamics, the energetic electron travels in its own conduction band substantially without collision being totally reflected from the potential wall at one end of the cylinder; and returning to an assymmetric tunnel junction at the other end, where it is either transmitted or reflected without energy loss.

In the macro regime, conventional electrical theory applies with its concepts of resistance, resistive loss, capacitance. In the quantum regime an energy quantum is totally absorbed by an electron, producing an energetic electron which travels within its potential well, until it penetrates the tunnel junction. Upon passing through the junction, the electron gives its energy to the electric field, becoming a thermal electron at a greater potential energy. Reverse current through the junction is constant, being limited by the junction structure and electric voltage. The forward current in the quantum regime is limited only by the input rate of energy quanta. Hence the forward/reverse current ratio of the Femto Diode may be very large.

The tunnel junction used in the Femto Diode of this invention comprises an assymetric Metal 1—Insulator—Metal 2 configuration. The first metal and its insulating interface has a work function $\phi_1$ in the range of 1.1 to 1.9 eV; and the second metal and its insulating interface has a work function $\phi_2$ in a range from 1.8 to 3.2 eV. A result of the analysis herein is that a maximum forward/reverse current occurs when $(\phi_1/\phi_2) \approx 0.6$. The insulating barrier has a thickness s which depends on the selected current density; for example, from 28 to 38 Å for a current density in the range 0.1 to 10 amps/cm$^2$. The dimensions of the facing metal surfaces are submicron, <100 Å × 100 Å.

The tunnel junction used in the Femto Diode of this invention facilitates the tunnelling transmission of an electron in the forward direction through the insulating barrier; and impedes the tunnelling transmission of an electron through the insulating barrier in the reverse direction. The total absorption of a light photon accelerates a single electron to a velocity determined by the energy of the photon.

The tunnel junction of the present invention is based upon the discovery of the particular values of the work functions $\phi_1$ and $\phi_2$ of metal 1 and 2, and their insulator interfaces, respectively; the barrier thickness s; and the cross-section A; for which the forward and reverse tunnel currents have a maximum ratio of about 14; and in which the forward average current through the diode area of 50 Å × 50 Å is about 2.2 × 10$^{-13}$ amps; and for which the average forward current density is about 0.88 amps/cm$^2$.

The Femto Diode described herein has an efficiency of at least 90%, and is useful for many applications disclosed hereinafter.

The mathematical physics Section 9 which follows establishes the basic relationships and critical values required to construct a Femto Diode in accordance with this invention.

WORK FUNCTION

The work function of a metal[9] is defined as the difference between the electric potential of an electron outside the surface (−eV) and the electron potential of an electron inside the same metal $$\phi = -eV - \mu \qquad (0.1)$$

The work function $\phi$ is also the energy difference separating the top of the valence band (the Fermi energy) from the bottom of the conduction band at the surface of the metal.

The work function of a metal can be changed by the adsorption of one or more monolayers of positive or negative ions at the metal surface to change the electric potential distribution.[9.1] The change in the work function $\Delta\phi$ depends upon the crystal orientation of the metal surface, the chemical structure of the adsorbate ions, and the number of monolayers. The work function can increase or decrease depending on the nature of the adsorbate. The change in the work function also depends on the order in which the interface ions are deposited.[8.1]

Table II shows experimental data for the decrease in work function $\phi$ on various metal substrates for various adsorbates. These combinations of materials are illustrative and not limiting.

TABLE II

Decrease of Work Functions for Metals[10] and Adsorbates Experimental Data and References.

| METAL | SYMBOL | CRYSTAL FACE | WORK FUNCTION $\phi$ eV | ADSORBATE Material | ADSORBATE Formula/ Order of Deposition | RESULTING WORK FUNCTION $\phi^1$ eV | DECREASE IN WORK FUNCTION $-\phi$ eV | REF. NO. |
|---|---|---|---|---|---|---|---|---|
| Aluminum | Al | | 4.28 | Aluminum Oxide | Al$_2$O$_3$ on Al | 1.64 | 2.64 | 8.1 |
| | Al | | 4.28 | | Al on Al$_2$O$_3$ | 2.40 | 1.88 | 8.1 |
| Iridium | Ir | | 5.27 | Barium Oxide | BaO on Ir | 1.4 | 3.87 | 11 |
| Nickel | Ni | 100 | 5.15 | Sodium | Na on Ni | 2.15 | 3.00 | 9.1 |
| Nickel | Ni | 112 | 5.15 | Oxygen | O$_2$ on Ni | 4.15 | 1.0 | 9.1 |

For a specific wavelength $\lambda$, expressed as eV, the work function $e\phi_2 = eV$; or $\phi_2 = V$. It is shown in Section 9 that a peak ratio of $(j_2/j_1)$ or $\overline{R}/\underline{R}$ occurs across the junction when $\phi_1 = 0.6$ $\phi_2 = 0.6$ V.

Table III illustrates this relationship for 3 wavelengths.

TABLE III

Wavelength versus work functions $\phi_1$ and $\phi_2$.

| COLOR | Wavelength Å | V = $\phi_2$ eV | $\phi_1$ 0.6 $\phi_2$ | INTERFACE MATERIALS REF. $\phi_2$ | $\phi_1$ |
|---|---|---|---|---|---|
| RED | 7000 | 1.77 | 1.06 | 2-1 | 1-1 |
| GREEN | 6300 | 1.97 | 1.18 | 2-2 | 1-2 |
| BLUE | 4000 | 3.10 | 1.86 | 2-3 | 1-3 |

The following Table IV illustrates the method of selecting metals to match the work functions listed in Table III for specific wavelengths.

TABLE IV

METHOD OF SELECTING INTERFACE MATERIALS 2-1 Work Function Required $\phi_1 = 1.06$

| Adsorbate/ Metal | -Δ$\phi$ Observed | Required Work Function of Metal Δ$\phi$ + $\phi$ = $\phi_{M1}$ | Metal Selected From Table of Work Functions $\phi_{M1}$ |
|---|---|---|---|
| BaO/Ir | 3.87 | 4.93 | Mo(111),Be,Co Ni(110) |
| Na/Ni | 3.00 | 4.06 | Al(110),Hf,In,N ,Z |
| Al$_2$O$_3$/Al | 2.64 | 3.70 | Mg,U |
| Al/Al$_2$O$_3$ | 1.88 | 2.94 | Tb,Y,Li,Gd |

2-2 Work Function Required $\phi_2 = 1.77$

TABLE IV-continued

METHOD OF SELECTING INTERFACE MATERIALS

| Adsorbate/ Metal | $-\Delta\phi$ Observed | Required Work Function of Metal $\Delta\phi + \phi_2 = \phi_{M2}$ | Metal Selected From Table of Work Functions $\phi_{M2}$ |
|---|---|---|---|
| BaO/ir | 3.87 | 5.64 | Pt |
| Na/Ni | 3.00 | 4.77 | Ag(111) Fe(111) M |
| Al$_2$O$_3$/Al | 2.64 | 4.41 | Sn, Ta, W, ZΓ |
| Al/Al$_2$O$_3$ | 1.88 | 3.65 | Sc, Mg |

Tables II, III, and IV illustrate selection principles which may be utilized to obtain the required values of $\phi_2$ and $\phi_1$ for a tunnel junction matched to a particular energy $eV=\phi_2$.

(1) Metals, absorbates, and the observed change in work function $\Delta\phi$ are listed in Table II.

(2) The work function of the metal surface is added to the decrease in work function $\Delta\phi$ produced by the adsorbate/interface to obtain the work function required for the metal.

(3) From the Table of Work Functions of the Elements[8], Candidate metals are selected which have a work function close to the required work function calculated in Table III.

(4) The order of deposition must be taken into account; for example; Ni/BaO or BaO/Ni For example: In Table (2-1) line 1, the metal selected Mo, Be, Co, Ni is tested with the adsorbate BaO such as: BaO/Ni; BaO/Co; etc.

The selection of materials for a junction suited to each wavelength range has been illustrated with examples. Other combinations of materials may be employed for the metal surface: alloys, surfaces with ion implantation, semimetals such as bismuth and the like, and various crystal orientations.

Other materials may be employed for the adsorbate: metal oxides, alkali metals; the number of monolayers may be varied; and mixtures of adsorbates may be used. The order of deposition may be varied to change $\Delta\phi$.

The selection of materials for tunnel junctions having the requisite work functions $\phi_2$ and $\phi_1$ for each wavelength range may be made to meet these requirements using the available materials and techniques described above; or modifications thereon, which are within the purview of this invention, and may be varied without departing from the scope hereof.

The device is simple and inexpensive. It utilizes a readily available amorphous substrate such as glass, although it is not limited thereto. It does, however, require precision fabrication in a submicron facility. Electron beams may be employed to produce the extremely small structures required. X-ray or electron beam lithography may be employed to produce the masks. Ion beams or molecular beam epitaxy may be used to lay down the appropriate metal and insulating areas in a manner known to the art of producing submicron electronic devices. The insulating layer may be silicon dioxide, aluminum oxide, or other insulating layers known to the art. The metal cylinder may be a single crystal, which may form spontaneously in such small dimensions or which may be induced to crystallize by suitably heating and cooling the coating, and/or by the momentary application of electric or magnetic fields, and/or by epitaxial growth on a crystalline substrate. The metal cylinder may have any cross-section but is preferably square or rectangular high purity single crystal having a long mean free time; such as tungsten, [3.2, 13] for which $\tau=1.6\times 10^{-13}$ soc.

The laws of physics which apply to large-scale electrical circuits in the macro regime are different from the quantum electrodynamic laws of physics in the quantum regime. Because of the small current and time intervals concerned, individual electrons are utilized one at a time. In a Femto Diode, a single electron approaches the barrier travelling over submicron distances with an energy $\xi=h\nu=Ve$. Consequently, no charge cloud forms at the insulating barrier, and there is therefore no capacitance effect. The time constant equation is therefore not applicable to the submicron diode of the invention.

Figure 5:
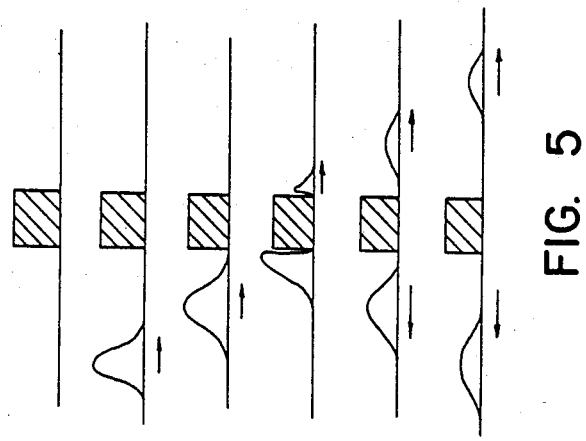
FIG. 5 shows a diagram of the probability waves of an energy packet penetrating a barrier according to known quantum theory.

The penetration of a barrier by an electron possessing an energy $eV$ slightly less than the barrier potential $e\phi$ occurs according to quantum mechanics by an effect known as "electron tunnelling through a barrier"[12.1]. According to the quantum theory of tunnelling, an electron moving in a metal approaching an insulating barrier, either passes through the barrier to the metal on the other side by "tunnelling"; or is totally repelled by the electric field potential at the barrier/metal interface, and reverses its direction of motion. This is illustrated in FIG. 5. The waves shown are transmission/reflection probability waves, not actual particles.[12.2]

According to the well-established theory, the effect occurs because an electron has a probability wave function which extends a considerable distance and penetrates a thin barrier ($s\approx 30$ Å). The probability of transmission of an electron passing through the barrier depends on various parameters, which are defined in the mathematical equations derived from fundamental considerations.

The passage of the electron through the barrier occurs because the location of an electron in space is indeterminate, expressed as a probability wave function of the electron being in a given position. This wave function extends over a distance of at least 100 Å which is greater than the thickness s of the insulating barrier; usually 28 to 38 Å for a Femto Diode.

The electron penetrates the insulating barrier because its position along the axis normal to the plane of the barrier is described by a probability law derived from the Schrodinger equation, from which the Tunnel Transmittance Equation (1) was derived.[12.3]

The electron may penetrate the barrier and appear on the other side, with its kinetic energy now converted to an equal quantity of potential energy; or, the electron may be reflected, and reverse its direction without loss of energy. In this invention the Femto Diode is usually attached to a lossless resonant well step, antenna, line or stub. A single electron oscillates back and forth in the well without loss of energy until it passes through the barrier.

These phenomena occur without loss because there are no electron collisions, and in the reversal of direction, the initial and final velocities of the electron are equal and opposite.

In this region the effective mass $m^*$ of an electron may be about 0.01 $m_e$ the rest mass of an electron. Hence, in a metal, the electron velocity increase from a given quanta of energy is greater than that of an electron in free space.[6.1,6.2,14.2,15.1]

As an example, the current through a Femto Diode may be about $1.6\times 10^{-13}$ amps; for which the number of single electrons/sec is: $N=10^6$ electron/sec; or 1 electron per sec. These are single electron events. In this device an electron may make many oscillations, returning to the barrier until it eventually passes through.

In the case of a Femto Diode, the concept of resistance R is applicable only to the forward or reverse currents during macro-regime operation. In macro-regime devices, resistance expresses the average flow rate of many electrons over a time scale of a second (amps) per unit voltage. The resistance concept is not applicable to the probability of an individual electron transmission through a tunnel junction, and so does not apply to a Femto Diode.

The general solution of the equations for tunnelling in the assymmetric system metal 1, insulator, metal 2, has been derived.[8] However, in the prior art, these equations were not applied to submicron diodes operating in the light frequency region with time periods in the 1.3 to 2.3 Femtosec (see Table 1), nor were the requisite relationships between the variables disclosed herein known.

The tunnel junction disclosed herein is a "quantum regime" device whether or not connected to a "quantum regime" input circuit, and therefore useful in other applications where high speed operation in the light frequency range is required. However, for the tunnel junction to be responsive to light frequency, it must be connected to a submicron component such as a $\lambda/4n$ antenna, a resonant well-step, stub, or other suitable quantum regime structure. If a material is used in which the effective electron mass is about equal to the electron rest mass, then many collisions may occur; in which case, the tunnel junction resistance is the minimum resistance calculated from the equations derived herein. However, when quantum regime operation occurs, then the forward resistance vanishes, and the Femto Diode of this invention operates at its maximum efficiency. The conditions for achieving quantum regime operation are specified herein.

7. BASIC PRINCIPLES OF THE FEMTO DIODE

1. A source of an energy quantum at or near light frequency about $10^{15}$ Hz, a photon-lightwave-plasmon.
2. Transfer of the quantum of energy to a single electron.
3. The electron moves with a long mean free path in a metal cylinder in its own energy band level; exclusion principle assures 1 electron per band level. Electron motion is lossless at constant velocity[1.1] The metal cylinder is preferably a single crystal[1.2] needle to increase the mean free path, and made of a metal which has a long mean free time.$\tau$[3.2, 13, 14.1]
4. Electron is in a potential well[12.2] in a length of metal which corresponds to a resonant frequency of the light photon.
5. The well is bounded by a potential wall characterized by the work function $\phi_2$ of the metal 2 relative to a vacuum (or the atmosphere) at one end, and by a metal 1, insulator, metal 2 semi-permeable tunnel junction at the other end.
6. When the electron tunnels through the junction, it does so without loss of energy. Electrons which do not penetrate the potential barrier are reflected therefrom, and reverse direction without loss of energy.
7. When the electron is reflected from the tunnel junction or by the potential wall at the other end of the metal cylinder, there is also no energy loss.
8. The mean free path exceeds the total travel in electron oscillation until it tunnels. Thus the electron oscillates within the well without loss until it tunnels through the junction without loss. Hence the tunnel junction has zero resistance during the transmission of an electron, and infinite resistance during the reflection of an electron. There is a voltage V across the junction which is provided by the electron's energy eV.
9. The electron has only a small thermal energy remaining after it passes through the barrier[16].
10. The average current from N electron charges per second is $e\tilde{N}=1.6\times10^{-19}N$ amps. This current denotes a resistance $R_L=V/e\tilde{N}$ ohms, which is not the resistance of the Femto Diode but is the resistance of the load. The current through the junction depends on the number of photons N per second absorbed by the electrons in the metal cylinder attached to the junction.
11. The junction itself is lossless, so substantially all the absorbed energy is transferred to the load.
12. The electrons which absorb the energy from the photons are termed "energetic electrons", and these travel in their own conduction band with high velocity and almost without loss because of the long mean free path of the electrons between collisions. The electrons reaching the other side of the barrier in metal 1 have given substantially all their energy to the electric circuit, and are no longer "energetic" but are now "thermal" electrons; the difference being one of kinetic energy possessed by the electron; for example: 2.2 eV for the former versus about 0.25 eV for the latter; a ratio of about 100. Consequently, in metal 1 the slow thermal electron is now just another electron belonging to the electron cloud, conforming to the statistical laws of the macro-regime, to which the conventional resistance concept is applicable; hence, the reverse current density $j_1$ through the junction 3 in FIG. 3 encounters a maximum tunnel resistance $\bar{R}$.
13. The forward current may be increased almost without limit by increasing the light intensity or $\tilde{N}$, the number of photons per second per dipole cell. This creates a corresponding number of energetic electrons per second in the potential well. Since the voltage V is constant, the output current increases proportionally to $\tilde{N}$; but, the reverse current is constant. Hence the Femto Diode of this invention is more efficient for greater incident light power. A limit occurs when so many individual energetic electrons are created that they fully occupy the free conduction band levels; whereupon the lossless quantum condition is replaced by the conventional resistance to the metal; in which state the ratio of forward to reverse current is that given by the tunnel junction only, without the quantum well-step shown in FIGS. 3 and 4.
14. The energetic electron in this case is a sole electron in a dipole antenna operating in the quantum regime. It is subject to quantum regime laws, which are different from the macro-regime RLC laws conventionally applied to antennae. Since RLC circuit theory does not apply in the quantum regime, the properties of the well-step quantum analysis discussed in connection with FIGS. 3 and 4 applies. The dipole antenna length b is adjusted to a ¼ cycle of the light frequency $\lambda$ so that $b=\lambda/4n$.

8. TABLE OF SYMBOLS

| SYMBOL | DESCRIPTION | NUMERICAL VALUE | UNIT | REFERENCE |
|---|---|---|---|---|
| b | Length of well, or antenna | | Å | |
| c | Velocity of light | $3 \times 10^8$ | m/s | |
| d | Width or thickness | | m, Å | |
| e | Charge on electron | $1.6 \times 10^{-19}$ | C | |
| h | Plancks constant | $0.6626 \times 10^{-33}$ | js | |
| j | Current Density | | $A/m^2, A/cm^2$ | |
| $j_1$ | Reverse Current Density | | $A/cm^2$ | |
| $j_2$ | Forward Current Density | | $A/cm^2$ | |
| m | Mass of electron at rest | $0.9109 \times 10^{-30}$ | Kg | |
| n | A number | | | |
| s | Thickness of Insulating barrier | | Å, m | |
| t | Time | | s | |
| $x_1$ | $0.496\, s\phi_1^{1.5}/[V - (\phi_2 - \phi_1)]$ | | | |
| $x_2$ | $0.496\, s\phi_2^{1.5}/[V - (\phi_2 - \phi_1)]$ | | | |
| $x_3$ | $0.496\, s\, (\phi_2 + \phi_1 - V)^{\frac{1}{2}}$ | | | |
| A | Area | | $m^2, Å^2$ | |
| G | A factor | | | |
| I | Current | | A | |
| J | Current Ratio $j_2/j_1$ | | | |
| $K_o$ | Constant Term | $7.93 \times 10^9$ | $A/cm^2$ | (25)(26)(27) |
| N | No. of photons | | | |
| R | Resistance per unit area | | $ohms/cm^2$ | |
| T | Time, Period of a full wave | | s | |
| $T_p$ | Tunnel transmittance Probability | | | |
| U | Velocity of energetic electron | | m/s | |
| V | Voltage | | volts | |
| $\alpha$ | 1.025, a conversion factor | | Å, eV | 8.2 |
| $\beta$ | A correction factor | 23/24 | | 8.3 |
| $\Delta$ | Increment | | | |
| $\epsilon$ | Dielectric constant of material | | | |
| $\epsilon_o$ | Dielectric constant of free space | $8.854 \times 10^{-12}$ | F/m | |
| $\rho$ | Resistivity | | ohm-cm | |
| $\lambda$ | Wavelength of light photon | | Å | |
| | Frequency of light photon | | Hz | |
| $\mu$ | Fermi Energy Level | | joules, eV | |
| $\xi$ | Energy | | joules, eV | |
| | Mean free time of electron between collisions sec | | | 15.3 |

| | SUBSCRIPTS |
|---|---|
| 1 | Reverse, except for $x_1$, see $x_1$ |
| 2 | Forward, except for $x_2$, see $x_2$ |
| 3 | See $x_3$ |
| 10 | Constant term of $j_1$ equation |
| 20 | Constant term of $j_2$ equation |
| o | Quantum regime |
| \| | Transition regime |
| e | Electron |

| | SUPERSCRIPTS |
|---|---|
| — | Maximum |
| — | Minimum |
| ' | Time rate |
| * | Effective |

9. MATHEMATICAL PHYSICS

FIG. 4 shows an idealized diagram of a potential well 40 with a step 41 at one end and a tunnelbarrier 42 at the other end. An incoming energy quantum, a photon 43, creates an energetic electron 44 which travels back and forth in the well 40 without loss until it passes entirely through the barrier 42 without loss. The electron 45 is totally reflected from the step 41. A mathematical equation has been derived from the fundamental laws of quantum mechanics for the tunnel probability of the electron passing through the barrier in this idealized case.[12.1]

This equation has been modified for use with a barrier of thickness s and potential energy $\phi_2 e$, and an energetic electron with a kinetic energy Ve, for which the Tunnel Transmittance is:[1]

$$T_p = \left\{ 1 + \frac{\sinh^2[8\pi^2 em/h^2]^{\frac{1}{2}} s[V(1 - V/\phi_2)]^{\frac{1}{2}}}{4(V/\phi_2)(1 - V/\phi_2)} \right\}^{-1} \quad (1)$$

The rest mass of the electron in free space is: $m = 0.9109 \times 10^{-30}$ Kg. However, in a conductive material the electron has an effective mass $m^*$ which may be as small as 0.008 m, depending on the nature and structure of the material. The concept of the effective mass $m^*$ has been extensively discussed in the literature[14.1, 15.1] and has been applied to tunnel junctions[6.1, 6.2].

The effective mass $m^*$ and charge $e^*$ is used instead of the m and e of free space to define a ratio;

$$G = [m^* e^*/me]^{\frac{1}{2}} \quad (2)$$

$$0.008 < G < 1 \quad (3)$$

Figure 2:
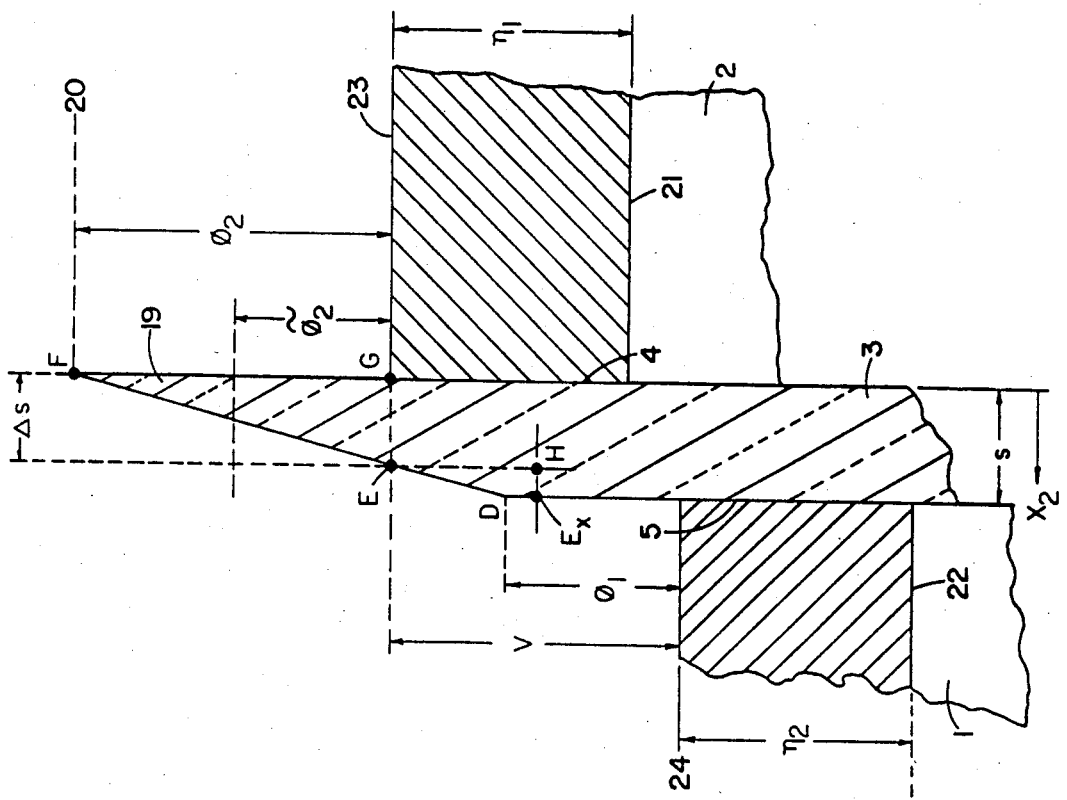
FIG. 2 shows an energy band diagram of the tunnel diode shown in FIG. 1 according to the prior art.

The value of G depends upon the material comprising the tunnel barrier,[0.2] its crystalline or amorphous structure, the presence of donor or receptor atoms, and the value of $\Delta s$ which replaces s (see FIG. 2). With the factor G, this explicit formula is obtained:

$$T_p = \left\{ 1 + \frac{\sinh^2 K_1 Gs[V(1 - V/\phi_2)]^{\frac{1}{2}}}{(V/\phi_2)(1 - V/\phi_2)} \right\}^{-1} \quad (4)$$

Evaluating the constant term:

$$K_1 = (\pi/h)(8em)^{\frac{1}{2}} = (\pi/0.6626 \times 10^{-33})(8 \times 1.60 \times 10^{-19} \times 0.9109 \times 10^{-30})^{\frac{1}{2}} \quad (5)$$

$$K_1 = 0.154 \quad (6)$$

From (4) and (5):

$$T_p = \left\{ 1 + \frac{\sinh^2 0.514 Gs[V(1 - V/\phi_2)]^{\frac{1}{2}}}{(V/\phi_2)(1 - V/\phi_2)} \right\}^{-1} \quad (7)$$

General equations applicable to assymetric tunnel junctions have been derived for different Voltage Ranges. It is understood that V and $\phi$ are both expressed in eV. In the low voltage region:

$$j_1 = j_{10}\{\widetilde{\rho}_1 e^{-\alpha\beta_1 S \widetilde{\rho}_1^{\frac{1}{2}}} - (\widetilde{\rho}_1 \rho eV) e^{-\alpha\beta_1 S(\widetilde{\phi}_1 + V)^{\frac{1}{2}}}\} \quad (8)$$

$$j_2 = j_{20}\{\widetilde{\rho}_2 e^{-\alpha\beta_1 S \widetilde{\rho}_2^{\frac{1}{2}}} - (\widetilde{\rho}_2 + V) e^{-\alpha\beta_1 S(\widetilde{\rho}_1 + V)^{\frac{1}{2}}}\} \quad (9)$$

Equations (8) and (9) apply in these ranges:

$$\widetilde{\rho}_1 = (\rho_1 + \rho_2 - V)/2 \quad 0 \leq V \leq \rho_2 \quad (10)$$

$$\widetilde{\rho}_2 = (\rho_1 + \rho_2 - U)/2 \quad 0 \leq V \leq \rho_1 \quad (11)$$

in which $$j_{10} = (e/2\pi h)/\beta_1 S^2 \quad (12)$$

$$j_{20} = (e/2\pi h)/\beta_2 S_2 \quad (13)$$

$$\widetilde{\rho}_1 = \rho_2 = \rho \quad (14)$$

$$\Delta S_1 = \Delta S_2 = S \quad (15)$$

In the high voltage region:

$$J_1 = J_{10}\{\widetilde{\rho}_1 e^{-\alpha\beta_1 \Delta S_1 \widetilde{\rho}_1^{\frac{1}{2}}} - (\widetilde{\rho}_1 + V) e^{-\alpha\beta_1 \Delta S_1 (\widetilde{\rho}_1 + V)^{\frac{1}{2}}}\} \quad (16)$$

$$J_2 = J_{20}\{\widetilde{\rho}_2 e^{-\alpha\beta_2 \Delta S_2 \widetilde{\rho}_2^{\frac{1}{2}}} - (\widetilde{\rho}_2 + 1) e^{-\alpha\beta_2 \Delta S_2 (\widetilde{\rho}_2 + V)^{\frac{1}{2}}}\} \quad (17)$$

Equations (16) and (17) apply in these ranges:

$$\widetilde{\rho}_1 = \rho_1/2 \quad V > \rho_2 \quad (18)$$

$$\widetilde{\rho}_2 = \rho_2/2 \quad V > \rho_1 \quad (19)$$

$$\Delta S_1 = S\rho_1/[V - (\rho_2 - \rho)] \quad (20)$$

$$\Delta S_2 = S\rho_2/[V + (\rho_2 - \rho_1)] \quad (21)$$

$$J_{10} = (e/2\pi h)/\beta_1^2 \Delta S_1^2 \quad (22)$$

$$J_{20} = (e/2\pi h)/\beta_2^2 \Delta S_2^2 \quad (23)$$

In the range $\phi_1 < V < \phi_2$ equations (8) and (17) apply, for $j_1$ and $J_2$. The second terms of the equations for $j_1$, $j_2$ and $J_1$, $J_2$ are negligible compared to the first terms. This may be shown by taking the ratio of these terms, and evaluating the result in the ranges used. Hence only the first terms of these equations are used, without loss of accuracy. Evaluating the constant terms:

$$\frac{\alpha\beta_1}{S_2} \approx \frac{\alpha\beta_2}{S_2} = 1.025 \times (23/24)/S_2 = 0.496 \quad (24)$$

The equations (8),(9) and (16),(17) may be simplified by these substitutions:

$$x_1 = 0.496 \, S\phi_2^{1.5}/[V - (\phi_2 - \phi_1)] \quad (25)$$

$$x_2 = 0.496 \, S\phi_2^{1.5}/[V + (\phi_2 - \phi_1)] \quad (26)$$

$$x_3 = 0.496 \, S(\phi_2 + \phi_1 - V)^{\frac{1}{2}} \quad (27)$$

In the parameters $x_1$, $x_2$, $x_3$ in the equations (25) to (27) the constant terms were multiplied by ($\frac{1}{2}$) to take account of this factor in (18) and (19), and by $(0.496)^2$ to use the parameters $x_1$ and $x_2$ in the equation, thus obtaining:

$$K_o = 6.2 \times 10^{10} \times \tfrac{1}{2} \times (0.496)^2 = 7.93 \times 10^9 \quad (28)$$

Table V shows values of the constant terms $j_{10}$, $j_{20}$; $J_{10}$, $J_{20}$; and the value $K_o$ used herein, with reference sources. The discrepancy appears to be between theoretically and experimentally derived factors.

TABLE V

| Value of constant term $K_o$ for Equation (29) in amps/cm² | | | |
|---|---|---|---|
| Constant Term | Equation | Value | Reference |
| $e/2\pi h$ | 12,13,22,23 | $2.10 \times 10^9$ | Theory, |
| $j_{10}$, $j_{20}$ | | $6.2 \times 10^{10}$ | 7.2 |
| $j_{10}$, $j_{20}$ | | | 8.4 |
| $K_o$ | 28, 29 | $7.93 \times 10^9$ A/cm² | Value used herein |

With these substitutions Equations (8),(9) and (16),(17) become:

$$J_2 = 7.63 \times 10^9 (\phi_2/\chi_2)^2 e^{-x_2} \quad (29)$$

The forward current density formula $J_2$ applies for the range $\phi_1 < V < \phi_2$ and $\phi_2 < V$; while the reverse current density $j_1$ applies in the range of $\phi_1 < V < \phi_2$; and the reverse current density $J_1$ only applies in the range $V < \phi_2$. Hence the ratio of forward/reverse currents are different in these ranges:

$$J_2/J_1 = (\phi_2/\phi_1)^2 (x_1/x_2)^2 e^{x_1-x_2} \; (V > \phi_2) \tag{30}$$

$$J_2/j_1 = [(\phi_2 - \phi_1 + V)^2/\phi_2(\phi_2 + \phi_1 - V)]e^{x_3-x_2} \phi_1 < V < \phi_2 \tag{31}$$

Forward minimum resistance per unit area of the tunnel junction alone is:

$$\underline{R}_2 = V/J_2 \tag{32}$$

but with the well step arrangement:

$$0 < \underline{R}_1 < V/J_2 \tag{33}$$

As the quantum regime is approached:

$$\underline{R}_2 \rightarrow R_o = 0 \tag{34}$$

The mathematical analysis herein was applied to the light frequency range:

$$1.8 < V < 3.2 \text{ volts} \tag{35}$$

The ratios of forward/reverse currents are computed from (30) and (31). For $j_2 = 0.88$ amps/cm$^2$, a maximum ratio $J_2/J_1$ and $j_2/j_1 \approx 14$ results when $$\phi_1 = 0.6 \phi_2 \tag{36}$$

and for s in Å:

$$s \approx 29 + 3(3 - V) \text{ Å} \tag{37}$$

9.1 EXAMPLES

Example 1

For a light flux of 500 watts/m$^2$ on a LEPCON ™ panel a $\lambda/2$ dipole antenna has a cross-sectional area $$A_c = \lambda^2/8n^2 \tag{38}$$

in a medium such as glass or plastic which has an index of refraction $n = 1.5$; for green light $\lambda = 5600$ Å, so the area is $A_c = (5600 \times 10^{-10})^2/8 \times (1.5)^2 = 1.74 \times 10^{-14}$ m$^2$. The incident light power on the area $A_c$ is:

$$P = 500 A_e = 500 \times 1.74 \times 10^{-14} = 8.71 \times 10^{-12} \text{ watts}$$

For $\lambda = 5600$ Å, $\nu = 0.535 \times 10^{15}$ Hz (from Table I) Each photon of green light has an energy $$\xi = h\nu = 0.6626 \times 10^{-33} \times 0.535 \times 10^{15} = 3.54 \times 10^{-19} \text{ joules}$$

The number of photons/sec = the number of electrons per sec absorbed by a single dipole, which is:

$$N = (8.71 \times 10^{-12}/3.54 \times 10^{-19}) = 25.6 \text{ electrons/sec} \tag{19}$$

If, instead, there are 9 dipoles of different lengths forming a grating antennae 50 Å wide, with a 50 Å spacing between them, then each dipole will absorb about one photon and create one electron for each $3 \times 10^{-7}$s or 0.3 μs (see FIG. 1) $\tag{40}$ and the power incident on each of the 9 dipoles is then $$8.71 \times 10^{12}/9 = 0.97 \times 10^{-12} \approx 10^{-12} \text{ w/dipole} \tag{41}$$

Example 2

The effective mass m* of the electron when it is in the metal conduction band is less than the rest mass of an electron isolated in space. The velocity U imparted to the electron by the incident photon is:

$$E = h\nu = eV = \tfrac{1}{2} m^* U^2 \tag{42}$$

$$\text{if } m^* = m/100 \tag{43}$$

$$U = [2eV/m^*]^{\frac{1}{2}} = [200 \; eV/m]^{\frac{1}{2}} \tag{44}$$

$$U = 200 \times 1.6 \times 10^{-9} \times 2.2/0.9109 \times 10^{-30} \tag{45}$$

The electron velocity in the cylinder well is then:

$$U = 8.8 \times 10^6 \text{ m/s} \tag{46}$$

The time to travel distance $b = 933$ Å 15:

$$t = b/U = 933 \times 10^{-10}/8.8 \times 10^6 = 1.1 \times 10^{-14} \text{ sec} \tag{47}$$

There is an interval of about $3 \times 10^{-7}$ sec between electrons. Hence there could be $3 \times 10^{-7}/1.1 \times 10^{-14} = 3 \times 10^7$ electron oscillations in the well, between impinging electrons. However, only a few oscillations of an electron should suffice before it tunnels through the barrier junction.

The conversion of the quantized input oscillating energy to direct current energy is instantaneous, the tunnelling is instantaneous, but there is a time delay $n_e \times 10^{-14}$ sec between these occurrences; where $\theta_e$ is the number of traverses of the well by electron.

This time delay will not detract from digitalizing the input power at close to light frequency.

Example 3

In conventional macro-diode regime, standard electrical laws apply. In standard electrical theory, the time constant of a resistance/capacitance element is:

$$t_c = RC \tag{48}$$

If the element is a diode with a square section of area d$^2$, where d is the length of an edge, and of thickness s then $$R = \rho(s/d^2) \tag{49}$$

and $$C = \epsilon \epsilon_o (d^2/s) \tag{50}$$

Hence $$t_c = \rho \epsilon \epsilon_o \tag{51}$$

For such an element the time constant $t_c$ is independent of dimension. Typical values for a tunnel diode with an insulating barrier are:

$$\rho = Rd^2/s \tag{52}$$

$$d = 1 \text{ cm} \tag{53}$$

$$\epsilon = 5 \text{ dielectric constant of insulator} \tag{54}$$

$$s = 35 \times 10^8 \text{ cm} \quad (55)$$

$$\underline{R} = 2 \text{ ohms/cm}^2 \text{ (from FIG. 17) at 2.2 eV} \quad (56)$$
$$= 2 \times 1/35 \times 10^{-8} = 5.7 \times 10^6 \text{ ohm-cm} \quad (57)$$

Putting these values into (51):

$$t_c = 5.7 \times 10^6 \times 5 \times 8.854 \times 10^{-12} = 2.5 \times 10^{-4} \, s \quad (58)$$

For a tunnel diode, the time constant $t_c = 2.5 \times 10^{-4}$ sec is obviously too great. In fact the response is reported to be at least fast enough to rectify 10 μm infra-red radiation[3] whose time period is:

$$T = \lambda/c = 10 \times 10^{-6}/3 \times 10^8 \approx 3 \times 10^{-14} \text{ sec} \quad (58.1)$$

This extreme contradiction in the time constant is explained by the operation of the tunnel diode in the quantum regime where macro-regime formulae are not applicable.

Example 4

Given a metal cylinder well has a cross-sectional area $$A = d^2 = (50 \text{ Å} \times 50 \text{ Å}) = (50 \times 10^{-8})^2 \text{cm}^2 \quad (59)$$

Find:
(1) reverse resistance of diode
(2) forward and reverse currents
(3) ratio forward to reverse current Maximum resistance per unit area is: for V = 2.2 volts (see FIG. 17)

$$R = 35 \text{ ohms} \quad (60)$$

The reverse resistance of the junction is:

$$R_1 = R/A = 35/(50 \times 10^{-8})^2 = 1.4 \times 10^{14} \text{ ohms} \quad (61)$$

The reverse current is:

$$I_1 = j_1 A = V/R_1 = 2.2 \times 1.4 \times 10^{14} = 1.6 \times 10^{-14} \text{ amps} \quad (62)$$

The ratio of forward to reverse currents is from FIG. 17

$$I_2/I_1 = 1.6 \times 10^{-14}/2.2 \times 10^{-13} = 14 \quad (63)$$

The forward photocurrent therefore is:

$$I_2 = 14 I_1 = 14 \times 1.6 \times 10^{-14} = 2.2 \times 10^{-13} \text{ amps} \quad (64)$$

The electric power output per dipole is:
$$P_c = V I_2 = 2.2 \times 2.2 \times 10^{-13} = 0.48 \times 10^{-12} \text{ w/dipole} \quad (65)$$

Referring to Example 1, Eq. (41) For 500 w/m² there is $10^{-12}$ watts incident on each of the 9 dipoles in the dipole cell area $A_c$; which is about twice the electric power output calculated in Equation (65).

Example 5

The solar radiation intensity in space is $$1393 \text{ w/m}^2. \quad (66)$$

Assuming a 50% overall system efficiency, about 700 w/m² of light power is available on earth. Each megawatt of sun-power requires 718 m² of LEPCON ™ panels (27 m × 27 m) and 1–10 m² of ELCON ™ panels in space, depending on the efficacy of heat dissipation of the ELCON ™ panels.

10. RESULTS OF THE ANALYSIS

The mathematical physics analysis is based on equations previously derived, which appear to be confirmed by experimental data. These equations are utilized herein, in a manner not heretofore disclosed, with particular ranges of values of electron energy 1.8 to 3.1 eV corresponding to visible light quanta and matched to the work functions $\phi_1$ and $\phi_2$ and barrier thickness s; and the tunnel junction characteristics described herein result from a new and novel relationship between these values.

The tunnel junctions described in the prior art, except for the barrier only, operate in the macro-regime. Because of the large dimensions of these prior art devices, the energy of electrons reflected from the thin barrier dissipates in collisions with atoms of the electrode.

Referring to Energy Band Diagram of FIG. 2, the value of s is replaced by $\Delta s$ in the tunnelling equations.

This substitution has the effect of decreasing G with a substantial increase in tunnel transmittance.

Figure 3B:
FIG. 3B is a fragmentary cross sectional view of the Femto Diode.
Figure 3A:
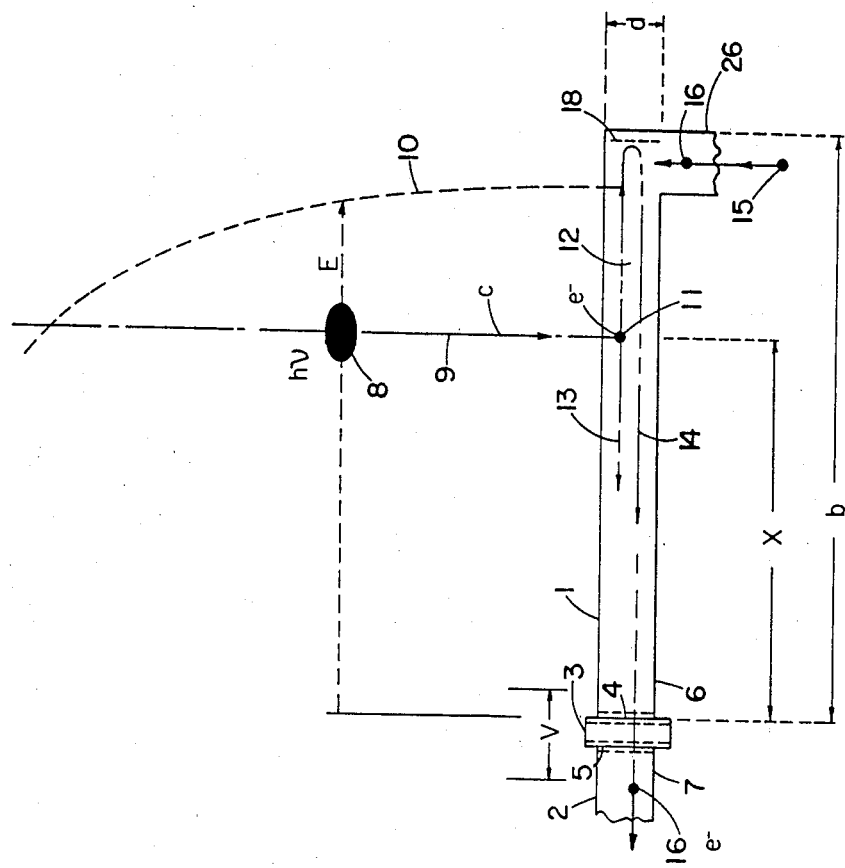
FIG. 3A shows a plan view of a Femto Diode of this invention, drawn to a scale of a million to one (10 cm/1000 Å).

The Femto Diode of this invention, shown in FIG. 3, is based on the ideal well-step configuration of FIG. 4, which eliminates or minimizes the collisions of the reflected electrons, conserving their energy, and facilitating almost lossless transmission through the barrier; is assymetric, and limits the reverse current $j_1$.

Figure 1:
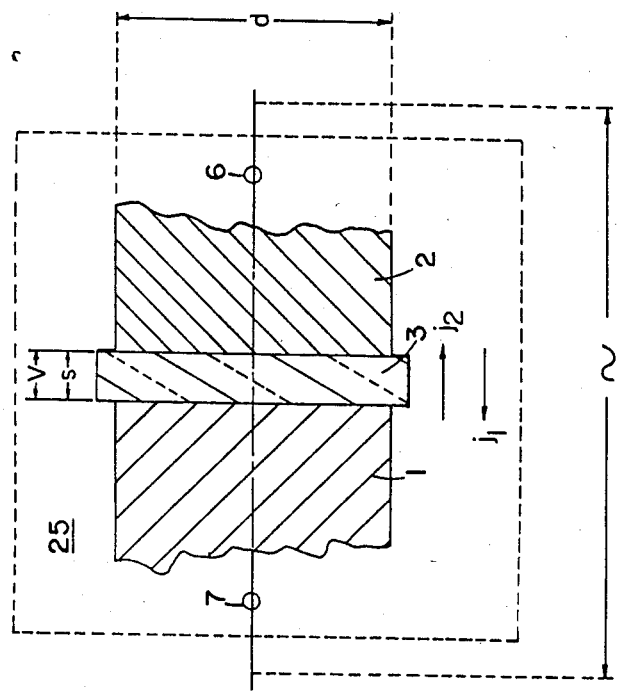
FIG. 1 shows a cross-sectional diagram of a tunnel junction comprising two different metals separated by a thin insulating layer according to the prior art.

The assymetric tunnel diode shown in FIG. 1, with the optimum values derived herein, will function as a Femto Diode only in combination with the well-step shown in FIGS. 3 and 4.

Figure 6:
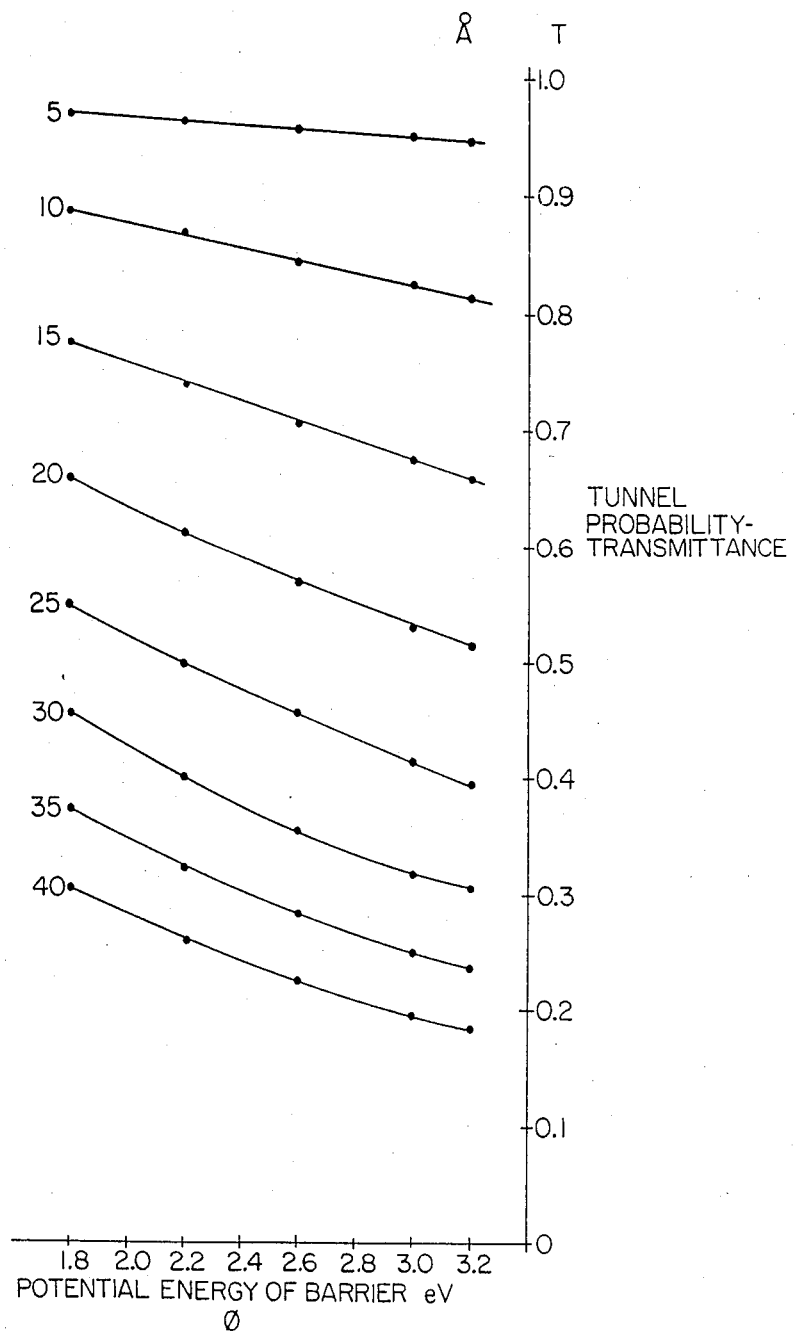
FIG. 6 shows a graph of Tunnel Transmittance versus the potential energy $e\phi$ of the barrier for an electron of energy=0.95 $e\phi$ passing through a barrier of thickness s in Å.
Figure 9:
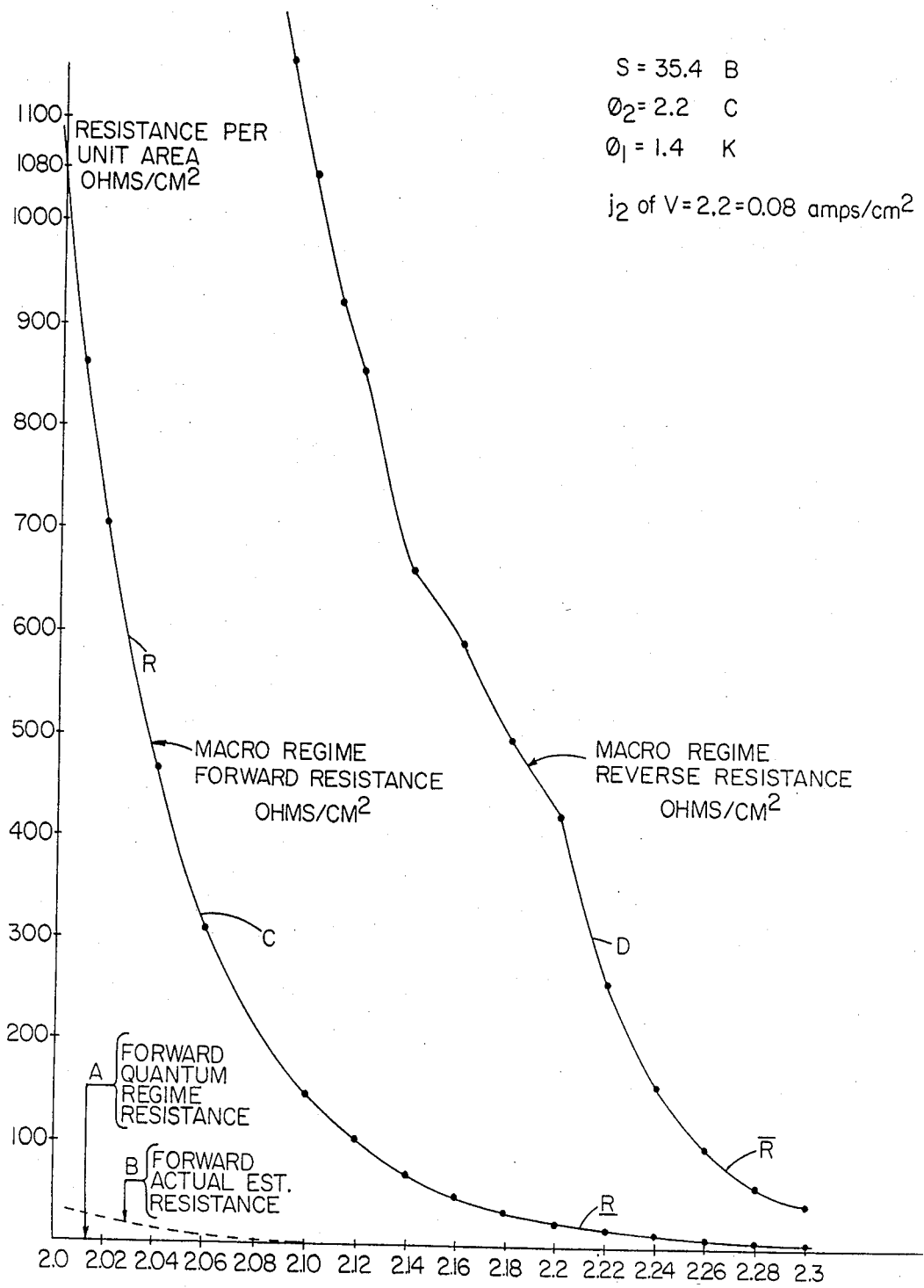
FIG. 9 shows a graph of forward/reverse resistance characteristics of a metal 1, insulator, metal 2 diode in the macroregime, showing the effects of reduction of scale to the quantum regime, in which the forward resistance ideally becomes zero (curve A), while the reverse resistance (curve D) remains unchanged.
Figure 10:
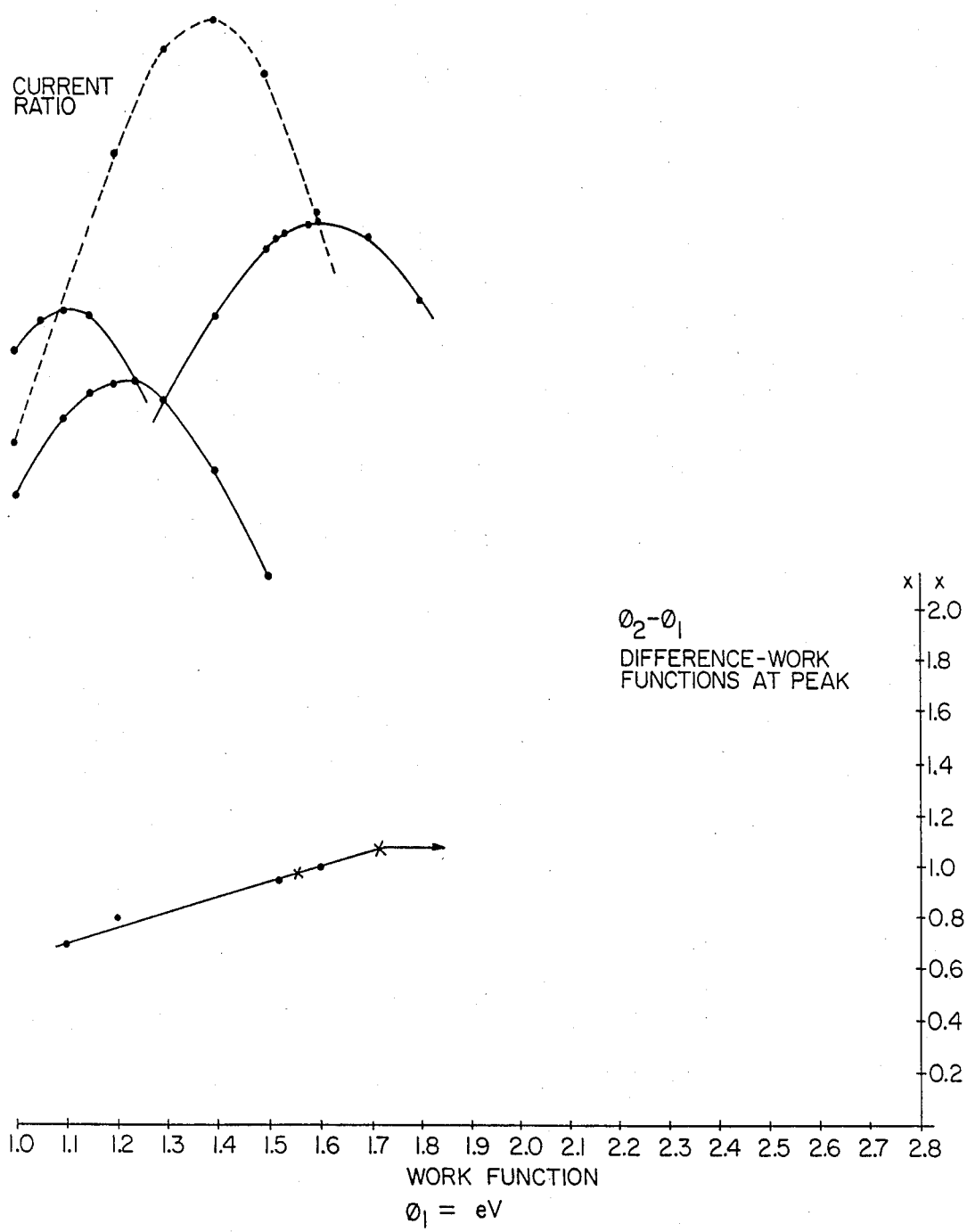
FIG. 10 shows for a tunnel junction graphs of the work function $\phi_1$ versus current ratio $(j_2/j_1)$ for various values of the work function $\phi_2$ and barrier layer thickness s.
Figure 11:
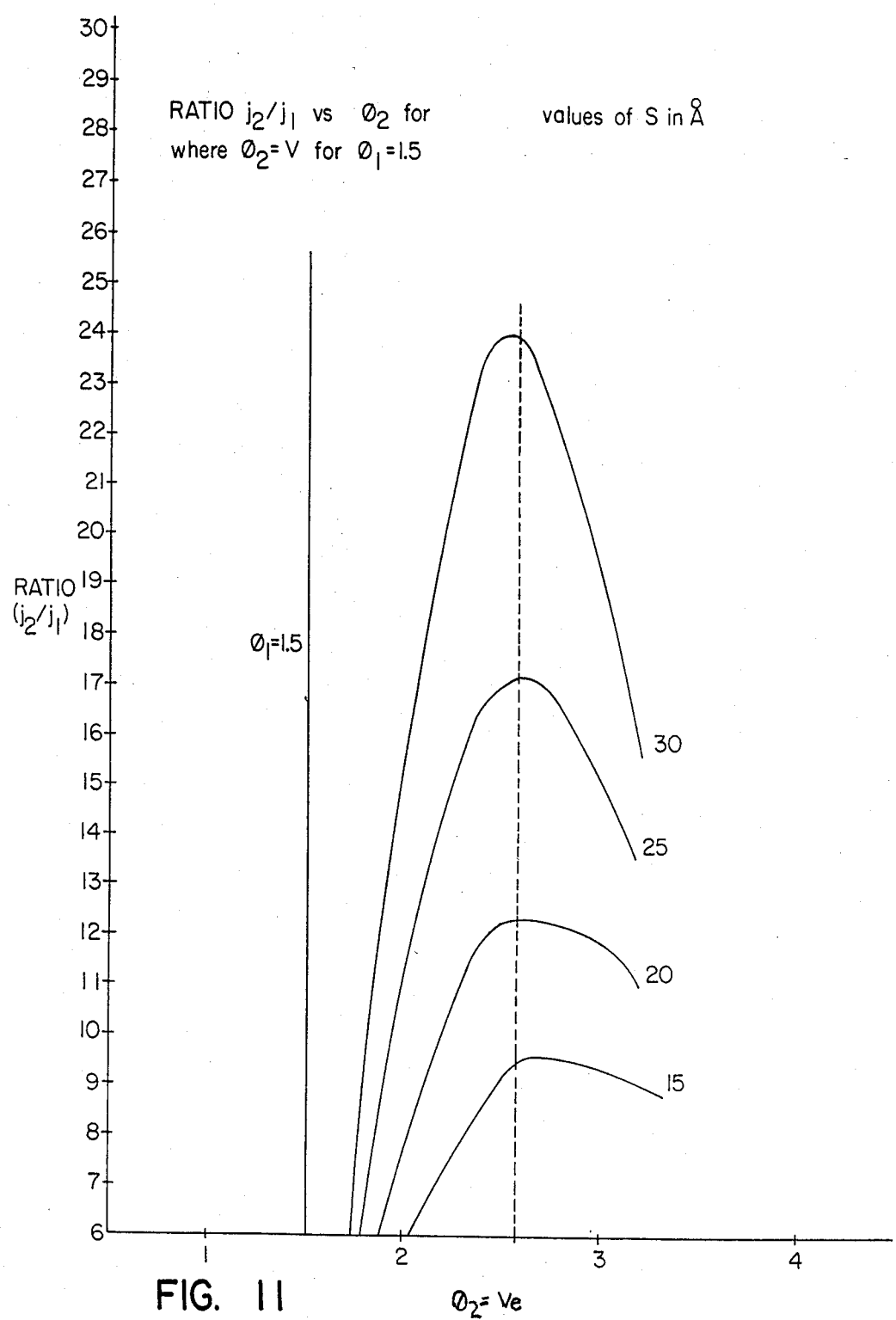
FIG. 11 shows for a tunnel junction graphs of $\phi_2$ versus forward/reverse current ratio $j_2/j_1$ in which $V=\phi_2$ and $\phi_1=1.5$ eV.
Figure 12:
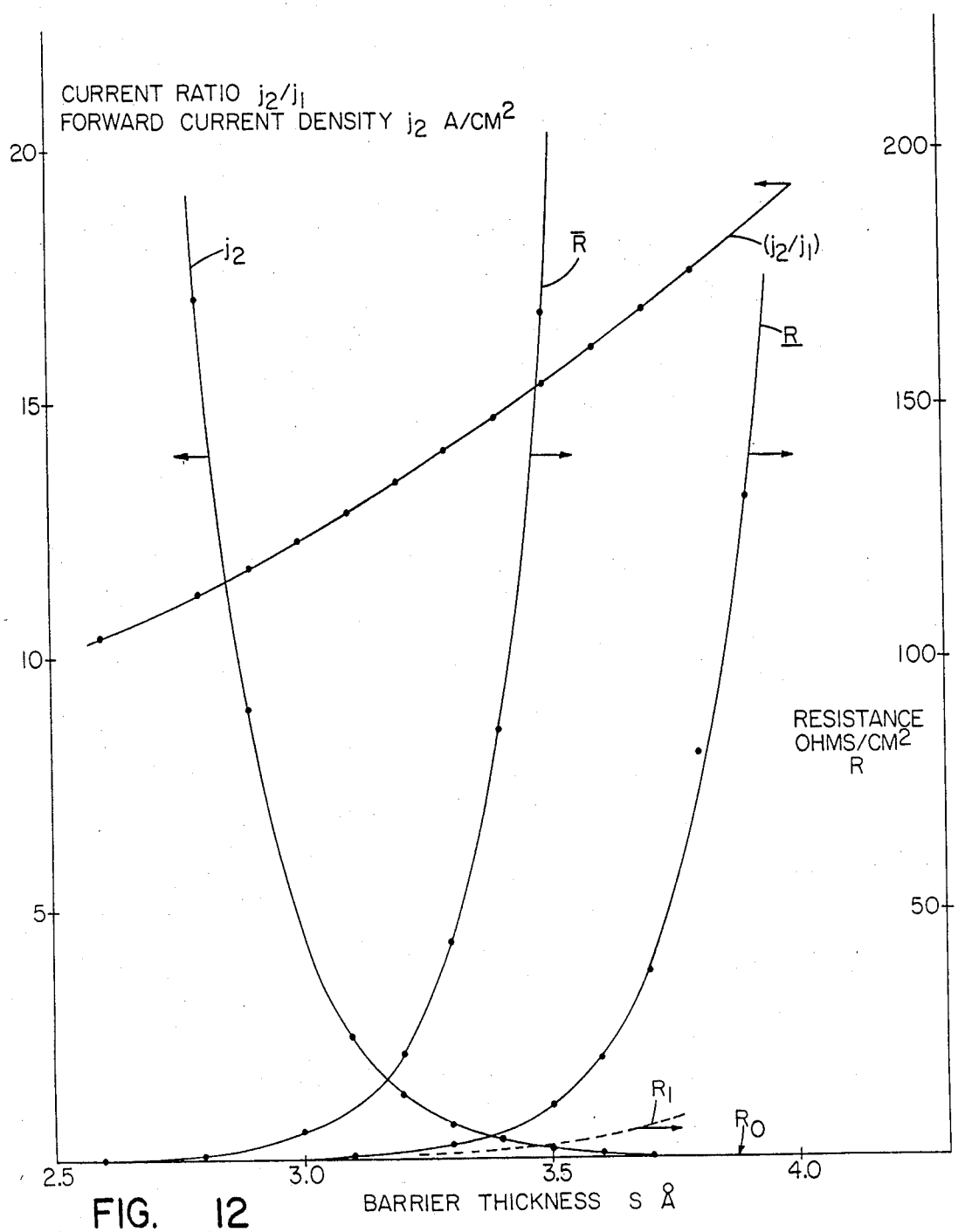
FIG. 12 shows for a tunnel junction the peak ratio of forward/reverse currents $(j_2/j_1)$ forward current density $j_2$ in amps/cm$^2$; maximum resistance $\bar{R}$ and minimum resistance R in ohms/cm$_2$ versus barrier thickness s in Å, for $\phi_1=1.32$ eV and $\phi_2=2.2$ eV.
Figure 13:
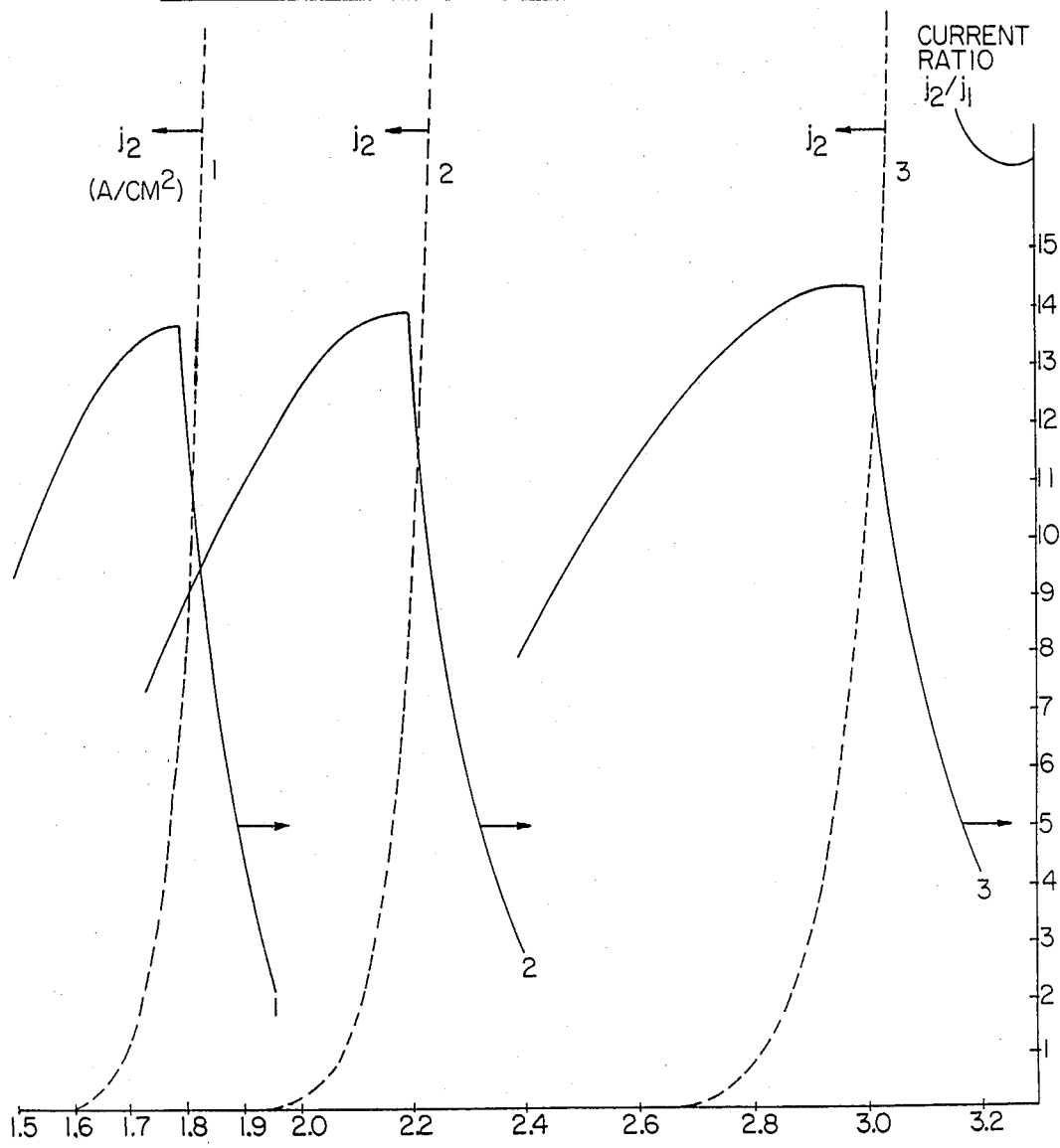
FIG. 13 shows for a tunnel junction current density $j_2$ in Amps/cm$^2$ and current ratio $(j_2/j_1)=J$ versus energetic electron energy eV for particular values of $e\phi_2=$eV.
Figure 14:
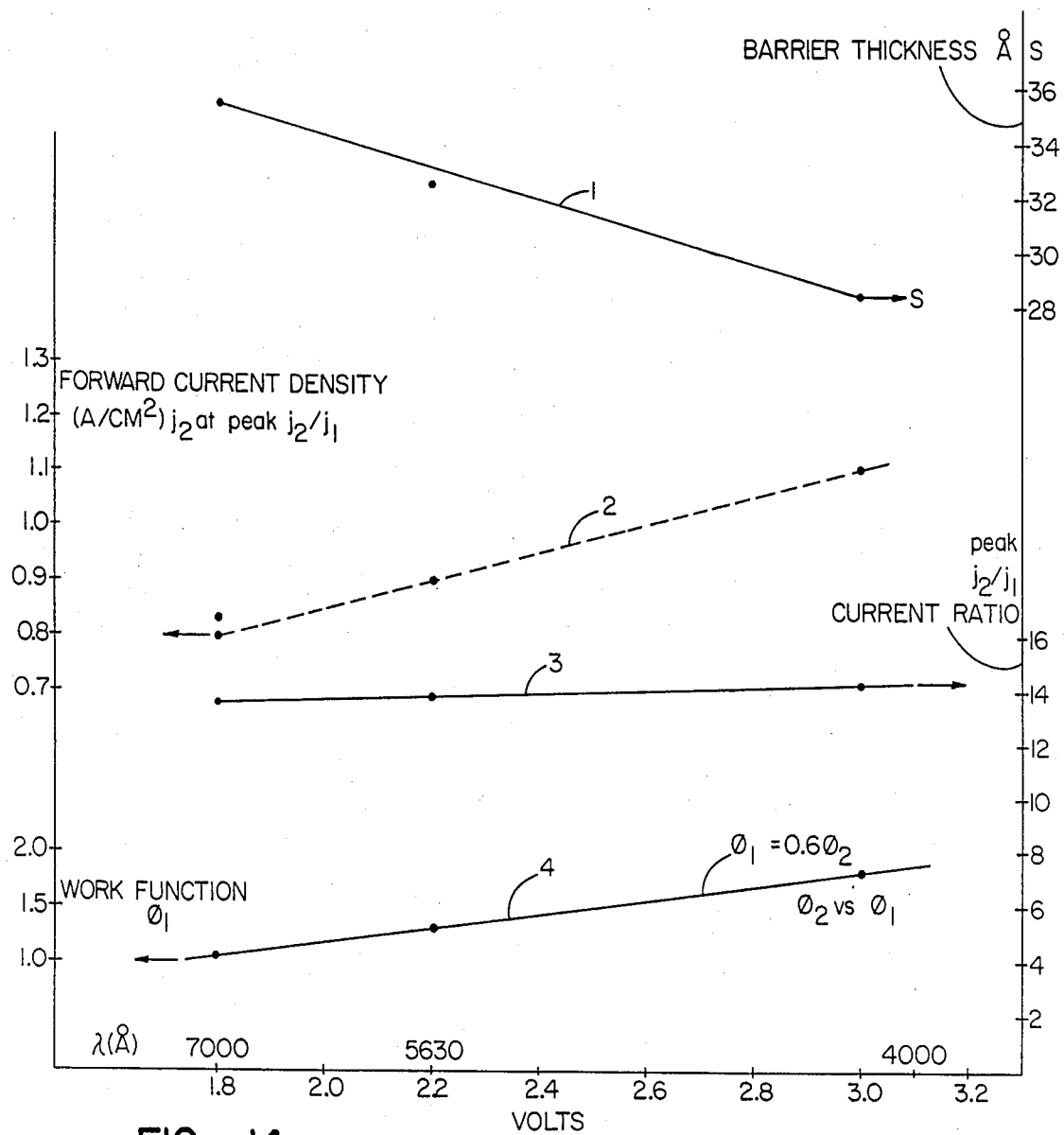
FIG. 14 shows for a tunnel junction graphs summarizing results of calculations in which $e\phi_2=$eV:
(1) Maximum current ratio $J_2/j_1$
(2) Barrier thickness s in Å.
(3) Work function $\phi_{1e}$ versus:
Electron Energy eV;
Corresponding light wavelengths in Å are shown.

Equation (1) was evaluated and the results plotted in FIGS. 6, 7 and 8. FIG. 6 shows Tunnel Transmittance T versus barrier potential energy $\phi$ for constant barrier thickness s in Å; FIG. 7 shows Tunnel Transmittance T versus G for constant barrier thickness s, and FIG. 8 shows Tunnel Transmittance T versus the ratio $V/\phi$, the energetic electron's kinetic energy eV to the barrier potential energy $e\phi$ for constant thickness s.

The results shown in FIGS. 6, 7 and 8 were derived for the ideal symmetric tunnel barrier shown in FIG. 4. The assymetric tunnel barrier, however, is more favorable toward forward transmission.

FIG. 6 shows the results of an evaluation of Equation (7) for T versus barrier potential $\phi$ for constant $V/\phi = 0.95$, and for values of the barrier thickness s from 5 to 40 Å. For example, the transmission probability is 0.5 for $\phi = 2.2$ eV and S = 25 Å; while for s = 35, T = 0.33.

The importance of a small value for G in the attaining of large tunnel transmittance is shown in FIG. 7; in which the Tunnel Transmittance T is plotted versus G for constant values of barrier thickness s, and for $(V/\phi) = 0.95$. Tunnel Transmittance in the 0.1 to 0.6 range is obtained with small values for G; which may result from small values of the effective electron mass m* and the effective electron charge e* and the substitution of $\Delta s$ for s. The effective electron mass is less in the insulating barrier than in the metal.[6.2]

FIG. 8 shows that Tunnel Probability increases as the electron energy eV approaches the Barrier Potential Energy $e\phi$.

The results of the computations using the modified early ideal formula (7) are consistent with reported theoretical and experimental work[6,7,8], and the formulae and results herein.

The tunnel junction of this invention comprises an assymetric barrier, in which s is replaced by the smaller value Δs, and the work functions of metals 1 and 2 are replaced by the work functions of the metal/insulator interfaces.

The electron mass and charge are also modified by the nature of the metals 1 and 2, and the interfaces of insulator 3; these factors are essential to a decrease in G, which increases probability of one-way electron tunnel transmittance in the range 10–60%. The time of electron travel in the metal cylinder 1 is minimized and the energy transmitted through the junction is maximized.

11. APPLICATIONS

11.1 IMPROVED LIGHT ELECTRIC POWER CONVERTER

Referring to FIG. 15 there is shown a schematic diagram of a light-electric power converter (LEPCON TM) using a plurality of dipole antennae; for example, 9, of different lengths in series, forming a parallel grating within a unit cell. The unit cell is the average cross-section of each dipole antenna to an incident photon. For a $\lambda/2$ antenna in a medium having an index of refraction n, the unit cell area $A_c = \lambda^2/8n^2$. However, the design shown in the FIG. 15 utilizes a $\lambda/4$ antenna which corresponds to a $\lambda/2$ antenna split at the center where the current is maximum; consequently, in this case, the unit cell area is $A_c = \lambda^2/16n^2$. The grating is constructed with about 50% open area between the dipoles. The minimum width of the dipole is taken as 50 Å.

The sun's visible spectrum has a power distribution which varies with wavelength, greater in the blue than in the red. Consequently, the antennae in the red end of the spectrum are designed to have a broader band, so that all the dipoles have the same average number of energetic electrons created in them per unit of time; and the current in each of the antennae is the same. The voltage generated in each antenna varies with the light frequency: $V = (h/e)\nu$. The length of $\lambda/4n$ antennae varies from 667 Å for $\lambda = 4000$ Å (blue to 1167 Å for $\lambda = 7000$ Å (red). The average length is 867 Å.

11.11 LIGHT/ELECTRIC POWER CONVERTER WITH ROTATOR

In FIG. 16 there is shown a LEPCON TM in combination with a light rotator and reflector to provide substantially total utilization of the incident light power; comprising a substrate 60 with a Lepcon TM array 30, with the long axis of the dipoles parallel to the plane of the drawing; the arrow 52 represents the resolved electric vector component of the incident light beam 53, which is ordinary unpolarized light indicated by the spoke symbol 54. The transmitted component is light ray 55 which is polarized with its electric vector normal to the plane of the drawing indicated by the dots 56 representing the normal vectors. The layer 57 is a ($\frac{1}{4}$) $\lambda$ optical rotator sheet which is entirely transparent, arranged with its axis at 45° to the normal vectors 56. The light ray 55 is transmitted through the rotator sheet 63 and is reflected by a silver or aluminum mirror 58 on a substrate sheet 62 and returns to the Lepcon TM layer as ray 57 with the electric vector 59 now parallel to vector 52; whereupon this light is also absorbed in the Lepcon TM array 30. Thus, substantially all the incident light power in ray 53 is absorbed. A protective layer 68 is placed over the LEPCON TM array 30 and all the components are laminated together using transparent adhesive layers 65, 66 and 67 to provide a unitary composite sheet.

11.2 ELECTRIC/LIGHT POWER CONVERTER (ELCON TM)

FIG. 18 shows an electric/light power converter, known as the ELCON TM Electric/Light power Converter, in cross-section to a scale of 500,000/1.

It is well known that a dipole antenna is reversible, absorbing electric energy as A.C. power from incident electromagnetic radiation (photons); or conversely, emitting electromagnetic energy (as photons) when A.C. power is fed to the antenna.

In FIG. 18, there is shown an antenna array 70 on a substrate sheet 71 with associated Femto Diodes 72 and steps 73 in a pattern similar to that shown in FIG. 15; except that all the antennae 70 have: (1) the same length, (2) a narrow width, (3) a length to width ratio of about 20/1, are sharply resonant to a narrow wavelength band, (4) have a narrow angular radiation pattern.

The antenna array 70 has a thickness of about 50 Å, and is between the thin transparent layers 71 and 74 of thickness $L_1 = \lambda/4n$ (about 1000 Å); this structure causes standing electromagnetic waves 75 to form between the parallel faces 76 and 77 of the layers 71 and 74. The layers may be made of any suitable transparent material such as silicon dioxide, or other such materials well known in the art.

Each of the supporting sheets 85 and 86 may have any convenient thickness; for example, $L_2 = 1$ cm. The standing electromagnetic wave 75 is a wave polarized with its electric vector E parallel to the long direction of the antenna.

The antenna and Femto Diode are in a well step configuration, such as shown in FIG. No. 3. The standing waves are formed between a reflective mirror surface 78 such as silver which has a 96% reflectivity in the visible region, and the partially reflecting surface 79 which has a light transmission of about 45% and a reflectivity of about 45%. Thus, the D.C. power input supplies the output radiant power 84 plus the internal losses. The conversion efficiency is between 50 and 90% depending on the average number of reflections in the cavity before the photon is emitted as a coherent laser beam.

In the ELCON TM electric/light power converter, D.C. power is applied to an array of series components in a configuration comprising an antenna 70 and a Femto Diode 72 in a well step 73. The Femto Diode direction is such as to inject energetic electrons (opposite to the LEPCON TM direction) into the well where they oscillate back and forth along the well axis.

The energetic electrons in the well, each with an energy $\xi$ are created with input energy $h\nu = eV$.

The conversion of electric power to light power in the ELCON TM occurs in the quantum regime.

(1) A potential difference V is established across a junction barrier in the Femto Diode 73. The junction barrier is biased to give an energy eV to the electron as it tunnels through the barrier. This causes the emission of light photons 82, 83 parallel to the plane of the diode by a "light-emitting-diode-effect", by which the increase in electron energy eV is converted to a photon energy $h\nu$.

(2) In passing through the junction the energetic electron loses its energy eV in creating the light photon, but has gained an equal energy in passing through barrier subject to the applied potential difference V, and so the energetic electron exits from the barrier with the same velocity it had on entering the barrier.

(3) A thermal electron in the well is also subjected to an increase in energy eV by the potential difference across the junction barrier; in crossing the barrier under the potential difference, it too emits a light photon hσ; but it exits as a thermal electron.

(4) Additional energetic electrons 81 are created in each of the antennae, by the antenna effect, which is the reverse of the photoelectric effect, the incoming photon 80 transfers its entire energy to the electron 81, which acquires a kinetic energy $\xi = Ve = h\nu$.

(5) This process is repeated at each of the series well step diode junctions.

(6) Electric power is supplied by the D.C. voltage and current supplied to the antennae array.

(7) The process is synchronized by the standing wave 75 to produce a coherent light output parallel to the ZZ' axis. The YY' axis is normal to the plane of the drawing.

(8) Alternately, the energetic electron may remain for a time in the well, where the applied D.C. power fills the conduction band levels of the metal of the well as electrons are supplied through the preceding junction.

(9) The energetic electrons are "stimulated" by the standing wave to radiate, just as in a laser. The energetic electrons in the well may radiate a photon when they fall to the potential level of thermal electrons in the metal.

(10) There is thus a conventional laser process occurring in this device. The input D.C. power pumps up the population of energetic electrons into conduction bands; while the cavity radiation field stimulates this population into a simultaneous return to a lower energy level, with consequent emission of coherent radiation from the junction, and/or from the antenna-well.

(11) The well step structure can support at least one electron at a time. For this level, the power has a theoretical limit of about 1000 Mw/m$^2$.

(12) The ELCON TM light/electric/power converter is simple laser whose output beam power is limited only by the available input power and the dissipation of the heat loss to prevent destruction by overheating.

11.3 LIGHT AMPLIFIER

In FIG. No. 19 there is shown a light amplifier comprising a LEPCON TM light/electric power converter and an ELCON TM electric/light power converter in combination.

In the figure, there is shown a light source such as an optical fiber 89 which emits a light beam 90 carrying a signal. The light beam 90 may have been attenuated to a low level because of transmission losses over a distance, and may require amplification to a level where it can be transmitted to a further distance. To accomplish this result the light beam 90 is intercepted by a "LEPCON" TM light/electric power converter 91, previously described herein. The LEPCON TM 91 generates a constant output voltage V across terminals 94 and 95 and a current I which is modulated by the signal intensity. A constant voltage $V_S$ from a voltage source 88 is placed in series with the LEPCON TM and a resistor R to generate a variable voltage across an ELCON TM electric/light power converter 101. The laser beam 105 is modulated by the variable voltage V and current I across terminals 96 and 97. The laser beam power is augmented by power source 97 of the converter 101. Since the Femto Diode current $j_2$ increases rapidly with a small increase in V in the vicinity of $\phi_2$ (see FIG. 17), a small variation in V produced by the modulated voltage, added to the constant voltage power from source 88, amplifies the modulated input light signal 105 to increase the output signal 105.

The components 91 and 101 may be integrated into a single device.

11.4 THE ELCON TM /LEPCON TM COMPUTER MATRIX

FIG. 20 shows an isometric exploded view of the ELCON TM /LEPCON TM computer matrix. In practice the components are combined in layers forming an integrated device.

ELCON TM emitter elements 121 are on/off to signify /. ELCON TM elements 120 are arranged in an XY matrix. Voltage $-V/2$ is supplied to the $X_i$ line and voltage $+V/2$ is supplied to the $Y_j$ line. Where the X and Y lines cross, the full voltage V is applied across the ELCON TM emitter. The ELCON TM device 121 has a threshold—it will not emit light when a voltage V/2 is across the element and is "off"; but produces full light emission for voltage V and is "on".

When the ELCON TM emitter is "on", it lases and produces a parallel beam 125 along a ZZ' axis incident on a LEPCON TM light/electric converter 140 which generates a voltage V across a second set of lines $X_i'$ and $Y_j'$ of a second matrix. The voltage V across the $X_i'$ and $Y_j'$ lines is used in the read out signifying the element 121 is "on" and showing its address.

By feeding back the power produced by each LEPCON TM element at $X_i'$, $Y_j'$ to $X_i$, $Y_j$, and adding power from a common source, the element 120 will remain on, until the common circuit is broken. Thus the combination acts as a memory element, with a designated address at i,j.

The matrix computer circuit employed may be any known in the art. The ELCON TM /LEPCON TM Computer matrix has these advantages over the current state of the art:

(1) Extremely small dimensions: each element 121 140 is about 500 Å×500 Å in area. The present minimum dimensions are about 2500 Å×2500 Å. Hence this device is 25× more compact than the current state of the art.

(2) The speed of the device is increased by a factor of 5 over present devices.

(3) The power requirements are less and there is less heat to dissipate.

(4) The substrate need not be a semiconductor crystal. It may be ordinary polished glass. Ordinary inexpensive materials are used in minute quantities. There is a great savings in cost.

(5) More computing capacity is therefore concentrated into a smaller volume, at less cost.

11.5 ELCON TM DISPLAY PANEL

FIG. 21 shows a magnified plan view of a flat display surface with individual ELCON TM element as pixels, generally indicated at 149. The pixels 149 may be designed to emit red, green, and blue or black and white; FIG. 22 shows a cross-sectional view. The pixels are actuated by a matrix drive circuit which applies 1.8, 2.2 or 3.0 volts across each of the respective pixels in accordance with the information being displayed.

In the FIG. 21, 150, 151, 152 are the red, green, and blue emitting pixels, each employing an ELCON TM emitter in a well step Femto Diode configuration as previously disclosed herein. The matrix circuit has $X_1Y_1$ drive lines for 1.8 volts (red) $X_2Y_2$ drive lines for 2.2 volts (green) and $X_3Y_3$ drive lines for 3.0 volts (blue). In other respects the matrix drive circuits may be those known to the art. The pixels 149 are placed upon a flat, or curved substrate, such as glass 153, and covered with a suitable protective layer 154. Drive circuits may be placed at the periphery of the device and drive lines 154, 155 placed between or under the pixels. The front surface 156 of the outer protective layer may be lenticulated, or diffusing to spread the collimated beams from the ELCON ™ Emitters.

11.51 ELCON ™ 2D/3D DISPLAY PANEL AND SYSTEM

FIG. 23 shows a display modified for use with a 2D/3D Compatible TV system. The device may be used for direct viewing, or for projection on a screen.

The 3D system is based upon the copending application Ser. No. 523,705, filed Aug. 16, 1983, which is included herein by reference.

The ELCON ™ emitters produce a polarized beam collimated parallel to ZZ' axis of a narrow wavelength band of colored light. The E vector of the emitted polarized light is parallel to the antenna comprising the ELCON ™ emitters. The pixels 160, 161, 162, 163, 164, and 165 are arranged so that their successive polarizing E vectors are emitted orthogonally; and each set of parallel polarized light rays, of the three colors, carry right eye and left eye stereo images, which are separated at the observer's eyes by a spectacle pair 170 having polarized lenses 171, 172 orthogonally arranged, as fully set forth in the said copending application.

11.6 SPACE POWER SOURCE

A first LEPCON ™ light/electric power converter may be deployed in a space orbit about the earth, and used to supply D.C. power to an ELCON ™ electric/light power converter which beams collimated coherent light to earth. On earth, a second LEPCON ™ array converts the light power from space to D.C. power. The D.C. power may be inverted to 60 cycle A.C. and fed to the power grid for consumption on earth.

Various modifications in the above may be made without departing from the scope of my disclosures.

12. REFERENCES

| | | |
|---|---|---|
| 1. Duke, C. B. | Tunnelling in Solids Book Academic 1969 | |
| 2. Elchinger, G. M. Sanchez, A. Davis, C. F. Jr. Javan A. | Mechanism of Detection in a High-Speed Metal-Metal Oxide-Metal Junction in the Visible Region and at Longer Wavelengths Journal of Applied Physics Vol. 47, No. 2 Feb. 1976 | |
| 3. Wang, S. | Antenna Properties and Operation of Metal-Barrier-Metal Devices in the Infrared and Visible Regions Applied Physics Letters Vol. 28, No. 6 March 15, 1976 3.1 New Approach needed Col. 1, last 4 lines, p. 305 3.2 Table I, p. 305, last line $\tau\text{-sec} = 1.6 \times 10^{-13}$ w | |
| 4. Heiblum, M. Wang, S. Whinnery, J. R. Gustofson, T. K. | Characteristics of Integrated MOM Junctions at D.C. and at Optical Frequencies IEEE Journal of Quantum Electronics, Vol. QE-14, No. 3 March 1978, p. 159-169 | |
| 5. Holm | The Electric Tunnel Effect Across Thin Insulator Films in Contact Journal of Applied Physics, Vol. 22, No. 5 May 1951 p. 569-574 |
| 6. Stratton, R. | Volt-Current Characteristics for Tunnelling Through Insulating Film Journal Physics Chemical Solids, Vol. 23, 1962, p. 1177-1190 6.1 Effective mass m* differs from free electron mass, see Table top p. 1185 M*/m varied from 0.2 to 0.29 6.2 Effective electron mass in insulator differs from that in metals $m_c$ |
| 7. Simmons, John G. | Generalized Formula for the Electric Tunnel Effect Between Similar Electrodes Separated by a Thin Insulating Film Journal of Applied Physics Vol. 34, No. 6 June 1963 7.1 Equations expressed in practical units, p. 1800 7.2 Current Equation (50) p. 1801 values of constant terms 7.3 Effect of Dielectric const. p. 1802 |
| 8. Hartman, Thomas E. | Tunnelling Through Assymetric Barriers Journal of Applied Physics Vol. 35, No. 11 Nov. 1964 8.1 p. 3292, Col. 2 Eq. (47) $\phi_1 = 1.64$ eV; $\phi_2 = 2.40$ eV for a thermal oxide 8.2 conversion factor $\alpha$ 8.3 correction factor $\beta$ 8.4 value of constant term equation 8.5 order of deposition col. 1, p. 3293 |
| 9. Murr. Lawrence E. | Interfacial Phenomena in Metals and Alloys book 1975 Addison-Wesley Publishing Co. Reading, Mass. 9.1 Work function alteration p. 266-268 |
| 10. | Handbook of Chem. & Physics 65th Edition 1984-1985 Work Function of the Elements E76-77 |
| 11. Shih, A. Haas, G. A. Marrian, C. R. K. | Preparation and Oxidation of a Thin BaO Film Naval Research Laboratory Applications of Surface Science 16 (1983) 93-105 North Holland Publishing Co. |
| 12. Rojansky, Vladimir | Introduction to Quantum Mechanics Prentice Hall, N.Y. 1946 12.1 Chapter V, p. 187-188 WKB Method, approx. solution of Schrodinger Equation for a barrier 12.2 Chapter VI, p. 207-221 Rectangular barriers, steps generalized WKB method 12.3 Chapter VI, p. 216, Equation (10) |
| 13. Fawcett, E. Griffiths, D. | Journal Physics & Chem. Solids 23, 1631 (1962) (long mean free time of electron in tungsten) |
| 14. Kittel, Charles | Introduction to Solid State Physics; J. Wiley & Sons, N.Y. 5th Edition 1976 14.1 long mean free path of electron 14.2 effective mass p. 218-246 14.3 special crystals p. 224 |
| 15. Ziman, J. M. | Principles of Theory of |

| | -continued | |
|---|---|---|
| | | Solids; Cambridge at the University Press, 2nd Edition, 1972 |
| | | 32 E. 57th Street, New York |
| | | 15.1 effective mass p. 178-179 |
| | | 15.2 tunnelling p. 190-196 |
| | | 15.3 relaxation time p. 218-220 |
| 16. | Carter, Giles K. | Principle of Physical and Chemical Metallurgy American Society for Metals Metals Park, Ohio 44073 P. 131 |

Having fully described my inventions, what I wish to claim is:

1. In a submicron diode well structure for the interchange of photon energy and electron energy, a first cylinder comprising a first metal, a second cylinder comprising a second metal, an insulating substrate, a surface on said substrate, said cylinders having a common axis parallel to said surface, said cylinders being deposited on said surface, said first and second metals having the work functions $\phi_1$ and $\phi_2$ respectively, first and second plane faces normal to said axis on adjacent ends of said first and second cylinders respectively, said faces being separated by a gap of distance s, an insulating layer in said gap, means for producing an energetic first electron in said first cylinder travelling along said axis, said insulating layer and said first and second metals on said cylinder faces providing an assymetric tunnelling barrier for said energetic electron, a third plane on said first cylinder normal to said comon axis and opposite said first plane, said third plane providing a potential barrier for reflecting said energetic electron, the space in said first cylinder between said first and third planes constituting a potential well for said energetic first electron, first and second terminals, said first and second terminals being connected to said first and second cylinders respectively, said energetic first electron moving back and forth along said axis in said potential well and eventually passing unidirectionally through said barrier from said first cylinder to said second cylinder and to said second terminal, a second electron, said second electron passing from said first terminal into said first cylinder to replace said first electron.

2. A submicron diode-well structure for the interchange of photon energy and electron energy according to claim 1, in which a first relationship between said first and second work functions is approximately:

$$\phi_1 = 0.6\phi_2$$

and in which a second relationship between said gap "s" and said work function "$\phi_2$" is approximately:

$$s = 37.5 - 3\phi_2$$

and in which a third relationship between the energy of said energetic electron and said work function $\phi_2$ is approximately $$\phi_2 = eV$$

where s is in Angstroms; e is the charge on the electron in Coulombs; $\phi_2$ is the energy of joules to move said energetic electron against said work function of said second metal; and eV is the energy in joules of said energetic electron.

3. In a submicron diode well structure for the interchange of photon energy and electron energy according to claim 2, said insulating layer having a dielectric constant "$\epsilon$", thereby decreasing the values of said work functions by a factor $1/\epsilon$ and satisfying said third relationship.

4. A submicron diode well structure for the interchange of photon energy and electron energy according to claim 3, comprising an alkali metal layer having the work function $\phi_1$, said alkali metal layer being at the interface between said first metal and said insulating layer, whereby $\phi_1$ is decreased by a factor of $1/\epsilon$ to 0.6 $\phi_2$ eV.

5. A submicron diode well structure for the interchange of photon energy and electron energy according to claim 1, in which said insulating layer comprises a metal oxide.

6. In an optoelectronic device, a circuit having an "on" state or an "off" state, respectively denoting a "1" or a "0", a first substrate sheet having a first surface, a second substrate sheet having a second surface, said first and said second surfaces being adjacent, a first element comprising a submicron diode well structure operating as an electric/light power converter on the said first surface, a second element comprising a submicron diode well structure operating as an light/electric power converter on said second surface, terminals on said first and second elements, said first and second elements being located on a common axis normal to said surfaces, whereby light from said first element is transmitted to said second element, an electric power source having a voltage $V_S$, said power source being connected in a series circuit with said first and second elements via terminals on each said element, a voltage $V_E$ on said first element causing the emission of a photon having an Energy $\xi = h\nu = eV_E$, said second element receiving said photon and generating a voltage $V_L = (h/e)\nu = V_E$, said voltage $V_S < V_E$ not being able to sustain a current in the said circuit in the absence of photon emission, but sufficient to replace power losses in the said circuit during photon emission, thereby maintaining the circulation of said electric current in said optoelectronic circuit while photons are emitted from said first element, said circuit then being in the "1" state; or, the said circuit being in the "0" state when the said photon emission stops, said circuit being established in the "1" state by a positive pulse across the said first element to initiate photon emission, and said circuit being established in the "0" state by a negative pulse across the said first element to stop photon emission.

7. A display device comprising, a substrate sheet, a surface on said substrate sheet, a plurality of diode well structures on said surface, said diode well structures being grouped to form a pixel, each said pixel being located along a line in a two-dimensional array on said surface, electrical image signal means to actuate said diode well structures in said pixels to emit light, whereby a light image corresponding to said electrical image signal is emitted from said surface.

8. A display device according to claim 7, in which said pixels are disposed in first, second and third pixel groups, said diode well structure in said first, second and third pixel groups respectively emitting blue, green and red light, electrical image signals to actuate each said pixel group, whereby a full colored light image is emitted from said surface.

9. In a light amplifier, a laser light emitting sheet, an optical cavity in said sheet, submicron diode well structures disposed in said sheet, an electric power source, said electric power source being connected across said submicron diode well structures, coherent light in said cavity, an external input light signal having a power $P_1$, said input light signal power being transmitted into said cavity and modulating said coherent light, a light signal output power $P_2$ from said cavity, said electric power source increasing said output light signal power $P_2$ relative to said input light signal power $P_2$.

10. In a device for the interchange of photon energy and electron energy, a submicron diode well structure comprising, an insulating substrate, a surface on said substrate, a first cylinder, a second cylinder, said cylinders being made of metal deposited on said surface, said cylinders having a common axis parallel to said surface, first and second plane faces normal to said axis on adjacent ends of said first and second cylinders respectively, said first and second plane faces being separated by a gap of distance s, first and second metals having the work functions $\phi_1$ and $\phi_2$ respectively, said first and second metals being deposited in layers on said first and second plane faces respectively, an insulating layer in said gap, a third plane on said first cylinder normal to said common axis and opposite said first plane, means for producing an energetic first electron in said first cylinder travelling along said axis, said insulating layer and said first and second metals on said cylinder faces providing an assymetric tunnelling barrier for said energetic electron, said third plane providing a potential barrier for reflecting said energetic electron, the space in said first cylinder between said first and third planes constituting a potential well for said energetic first electron, first and second terminals, said first and second terminals being connected to said first and second cylinders respectively, said energetic first electron moving back and forth along said axis in said potential well and eventually passing unidirectionally through said barrier from said first cylinder to said second cylinder and to said second terminal, means for providing a second electron, said second electron passing from said first terminal into said first cylinder to replace said first electron, an electrical component, said component being connected to said terminals to complete a circuit for said electron energy.

11. In a device for the rectification of AC electron energy to DC electron energy, a submicron diode well structure comprising, an insulating substrate, a surface on said substrate, a first cylinder, a second cylinder, said cylinders being made of metal deposited on the said surface, said cylinders having a common axis parallel to said surface, first and second plane faces normal to said axis on adjacent ends of said first and second cylinders respectively, said first and second plane faces being separated by a gap of distance s, first and second metals having the work functions $\phi_1$ and $\phi_2$ respectively, said first and second metals being deposited in layers on said first and second plane faces respectively, an insulating layer in said gap, a third plane on said first cylinder normal to said common axis and opposite said first plane, means for producing an energetic first electron in said first cylinder travelling along said axis, said insulating layer and said first and second metals on said cylinder faces providing an assymetric tunnelling barrier for said energetic electron, said third plane providing a potential barrier for reflecting said energetic electron, the space in said first cylinder between said first and third planes constituting a potential well for said energetic first electron, first and second terminals, said first and second terminals being connected to said first and second cylinders respectively, said energetic first electron moving back and forth along said axis in said potential well and eventually passing unidirectionally through said barrier from said first cylinder to said second cylinder and to said second terminal, means for providing a second electron, said second electron passing from said first terminal into said first cylinder to replace said first electron, an electrical component, said component being connected to said terminals to complete a circuit for said electron energy.

12. In a device for the rectification of AC electron energy to DC electron energy, a submicron diode well structure according to claim 11, said diode operating in the macroregime characterized by a peak forward-/reverse current ratio less than about 14.

13. In a device for the rectification of AC electron energy to DC electron energy, a submicron diode well structure according to claim 11, said diode operating in the transition regime characterized by a peak forward-/reverse current ratio $>14$ for an energetic electron having a kinetic energy $\xi=\frac{1}{2}m^*U^2=eV$ where V is in volts, e is the charge on the electron in Coulombs, $m^*$ is the effective mass of the electron in Kg., U is the velocity of the electron in the metal in m/s, and $\xi$ is the Energy in joules.

14. In a device for the rectification of AC electron energy to DC electron energy, a submicron diode well structure according to claim 11, operating in the quantum regime characterized by a peak forward/reverse current ratio $>>14$ for an energetic electron having a kinetic energy $\xi=\frac{1}{2}m^*U^2=eV$ where V is in volts, e is the charge on the electron in Coulombs, $m^*$ is the effective mass of the electron in Kg., U is the velocity electron in the metal in m/s, and $\xi$ is the Energy in joules.

15. In a device for the interchange of photon energy and electron energy, a submicron diode well structure according to claim 10, said electrical component comprising an electric power source providing a potential difference of V volts to said first electron in said potential well, said voltage V providing said first electron with an energy eV, said first electron eventually tunnelling across said gap, whereby the energy of said first electron is converted to an emitted photon of the same Energy:

$$\xi=eV=h\nu \text{ Joules}$$

said photon having a frequency:

$$\nu=(e/h)V \text{ Hz.}$$

16. In a device for the interchange of electron energy and photon energy, a submicron diode well structure according to claim 10, said electrical component comprising an electric power source providing a voltage V in the range $$1.77>V>3.1 \text{ Volts}$$

to said first electron in said potential well, said voltage V providing said first electron with an energy eV, said first electron eventually tunnelling across said gap, whereby the energy of said first electron is converted to an emitted light photon of the same Energy:

$$\xi=eV=h\nu \text{ Joules}$$

said photon having a frequency in the range:

$$0.428 \times 10^{15} > v > 0.750 \times 10^{15} \text{ Hz}.$$

17. In an electric/light energy converter, a submicron diode well structure comprising, an insulating substrate, a surface on said substrate, a first cylinder, a second cylinder, said cylinders being made of metal deposited on the said surface, said cylinders having a common axis parallel to the said surface, first and second plane faces normal to said axis on adjacent ends of said first and second cylinders respectively, said first and second plane faces being separated by a gap of distance s, first and second metals having the work functions $\phi_1$ and $\phi_2$ respectively, said first and second metals being deposited in layers on said first and second plane faces respectively, an insulating layer in said gap, a third plane on said first cylinder normal to said common axis and opposite said first plane, means for producing an energetic first electron in said first cylinder travelling along said axis, said insulating layer and said first and second metals on said cylinder faces providing an assymetric tunnelling barrier for said energetic electron, said third plane providing a potential barrier for reflecting said energetic electron, the space in said first cylinder between said first and third planes constituting a potential well for said energetic first electron, first and second terminals, said first and second terminals being connected to said first and second cylinders respectively, said energetic first electron moving back and forth along said axis in said potential well and eventually passing unidirectionally through said barrier from said first cylinder to said second cylinder and to said second terminal, means for providing a second electron, said second electron passing from said first terminal into said first cylinder to replace said first electron, an electrical energy source, said source being connected to said terminals, said means being the electrical energy supplied by said source.

18. In a light/electric energy converter, a submicron diode well structure comprising, an insulating substrate, a surface on said substrate, a first cylinder, a second cylinder, said cylinders being made of metal deposited on the said surface, said cylinders having a common axis parallel to the said surface, first and second plane faces normal to said axis on adjacent ends of said first and second cylinders respectively, said first and second plane faces being separated by a gap of distance s, first and second metals having the work functions $\phi_1$ and $\phi_2$ respectively, said first and second metals being deposited in layers on said first and second plane faces respectively, an insulating layer in said gap, a third plane on said first cylinder normal to said common axis and opposite said first plane, means for producing an energetic first electron in said first cylinder travelling along said axis, said insulating layer and said first and second metals on said cylinder faces providing an asymmetric tunnelling barrier for said energetic electron, said third plane providing a potential barrier for reflecting said energetic electron, the space in said first cylinder between said first and third planes constituting a potential well for said energetic first electron, first and second terminals, said first and second terminals being connected to said first and second cylinders respectively, said energetic first electron moving back and forth along said axis in said potential well and eventually passing unidirectionally through said barrier from said first cylinder to said second cylinder and to said second terminal, means for providing a second electron, said second electron passing from said first terminal into said first cylinder to replace said first electron, an electrical load, said load being connected to said terminals, said means being the energy of a light photon incident on said first cylinder, said energy being delivered as electrical energy to said load.

19. In an electric/light energy converter according to claim 17, a plurality of said submicron diode-well structures disposed in an array, terminals on each said structures, common electric power input busses, said structures being connected in series and/or parallel to said common electric power input busses, main terminals on said busses, said structures, said terminals on said structures, said electric power input busses and said main terminals being unitarily deposited on said substrate surface, said electrical energy source providing electric power to said structures, said electric power being converted to light power emitted from said array.

20. In a light/electric energy converter according to claim 18, a plurality of said submicron diode-well structures disposed in an array, terminals on each said structures, common electric power output busses, the terminals on each of said structures being connected in series and/or parallel to said common electric power output busses, main terminals on said busses, said structures, said connections on said structures, said electric power output busses and said main terminals being unitarily deposited on said substrate surface, whereby light power incident on said array is converted to electric power supplied to said load.

21. In an electric/light energy converter according to claim 19, submicron diode-well structures having various lengths thus providing a wide band response, said structures being nested to utilize a maximum proportion of the surface.

22. In a light/electric power converter according to claim 20, said submicron diode-well structures having various lengths thus providing a wide band response, said structures being nested to utilize a maximum proportion of the surface.

23. A laser light emitting sheet for converting electric energy to light energy, comprising an insulating substrate, a surface on said substrate, a light reflecting layer on said surface on said substrate, a first transparent layer on said reflecting layer, a submicron diode well structure further comprising, a first cylinder, a second cylinder, said cylinders being made of metal deposited on said surface, said cylinders having a common axis parallel to said surface, first and second plane faces normal to said axis on adjacent ends of said first and second cylinders respectively, said first and second plane faces being separated by a gap of distance s, first and second metals having work functions $\phi_1$ and $\phi_2$ respectively, said first and second metals being deposited in layers on said first and second plane faces, respectively, said faces being separated by a gap of distance s, an insulating layer in said gap, an electric energy source providing an electric potential difference V across said gap, said energy producing an energetic first electron in said first cylinder travelling along said axis, said insulating layer and said first and second metals on said cylinder faces providing an assymetric tunnelling barrier for said energetic electron, a third plane on said first cylinder normal to said common axis and opposite said first plane, said third plane providing a potential barrier for reflecting said energetic electron, the space in said first cylinder between the said first and third planes constituting a potential well for the said energetic first electron, first and second terminals, said first and second terminals being connected to said first and second cylinders respectively, said energetic first electron moving back and forth along said axis in said potential well and eventually passing unidirectionally through said barrier from said first cylinder to said second cylinder and emitting a photon of energy $\xi=h\nu=eV$, means for providing a second electron, said second electron passing from said first terminal into said first cylinder to replace said first electron, a plurality of said diode-well structures deposited in said unitary layer onto said first transparent layer, said diode well structures being connected in series and/or parallel across said source, a second transparent layer on said unitary layer, a semitransparent reflecting layer, said semitransparent layer being deposited onto said second transparent layer, said first and second transparent layers each having a thickness $t_o=\lambda/4n$, where is the wavelength of the photon and $t_o$ is the thickness of the transparent layer, $\lambda$ and $t_o$ being in Angstroms, and where n is the index of refraction of each of said transparent layers, said layers in combination constituting a laser cavity on said sheet, wherein the emission of coherent light is stimulated in said diode-well structures, said coherent light being emitted from said sheet as a laser beam.

24. A plurality of optoelectronic circuits according to claim 6, in which said circuits are disposed in an array, said array constituting a computer matrix, electrical means for actuating said circuits, whereby a pattern of "1"s and "0"s is established on said matrix as information, said information being electrically written on, or read from said matrix.

25. A display device according to claim 7, in which the axes of said diode-well structures are parallel in each said pixel, whereby the light emitted from each said pixel is polarized with its electric vector parallel to said axes.

26. A display device according to claim 7, comprising a first set of said pixels and a second set of said pixels on said sheet, the pixels of said first and second sets alternating along a said line, said axes of said diode well structures of said first and second sets of pixels being orthogonal to each other, said first set of pixels emitting polarized light in a first plane presenting the right image, and said second set of pixels emitting polarized light in a second plane presenting the left image, said first and second polarized light planes being orthogonal, first and second electrical actuating means for said first and second pixels, respectively, to provide a polarized right image and a polarized left image, said right and left images being orthogonally polarized, spectacles containing right and left orthogonally disposed polarized filters, whereby said right and left images are transmitted respectively through said right and left polarized filters, said images appearing as a spatial Three Dimensional Image to an observer wearing said spectacles.

27. A light/electric power converter for converting substantially all incident light power to electric power, comprising a submicron diode-well structure according to claim 18, in which said axes of said diode-well structures are parallel, said light being incident on said structures as nonpolarized light photons having randomly oriented electric vectors, said nonpolarized light photons being resolved by said structures into a first set of photons with their electric vectors parallel to said axes, and to a second set of said photons with their electric vectors normal to said axes, a second substrate, a second surface on said second substrate, a reflecting layer, said reflecting layer being deposited on said second surface, a birefringent quarter-wave retardation sheet, said sheet being laminated between said first substrate and said reflecting layer, whereby said transmitted second set of light photons are reflected from said reflecting layer, the direction of the electric vectors of said second set of photons being rotated through 90° by passing twice through the said birefringent sheet, and whereby said first and second sets of photons are totally absorbed by said structures and converted to electric power delivered to said load.

* * * * *